(12) United States Patent
Strothmann et al.

(10) Patent No.: US 9,553,162 B2
(45) Date of Patent: Jan. 24, 2017

(54) SEMICONDUCTOR DEVICE AND METHOD OF FORMING SEMICONDUCTOR DIE WITH ACTIVE REGION RESPONSIVE TO EXTERNAL STIMULUS

(71) Applicant: STATS ChipPAC, Ltd., Singapore (SG)

(72) Inventors: Thomas J. Strothmann, Tucson, AZ (US); Steve Anderson, San Ramon, CA (US); Byung Joon Han, Singapore (SG); Il Kwon Shim, Singapore (SG); Heap Hoe Kuan, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 8 days.

(21) Appl. No.: 13/853,969

(22) Filed: Mar. 29, 2013

(65) Prior Publication Data

US 2013/0221452 A1   Aug. 29, 2013

Related U.S. Application Data

(63) Continuation-in-part of application No. 13/545,887, filed on Jul. 10, 2012.

(Continued)

(51) Int. Cl.

| H01L 29/66 | (2006.01) |
|---|---|
| H01L 21/56 | (2006.01) |
| H01L 23/00 | (2006.01) |
| H01L 27/146 | (2006.01) |
| H01L 23/31 | (2006.01) |

(52) U.S. Cl.
CPC .............. *H01L 29/66* (2013.01); *H01L 24/19* (2013.01); *H01L 24/20* (2013.01); *H01L 24/96* (2013.01); *H01L 24/97* (2013.01); *H01L 27/14618* (2013.01); *H01L 27/14683* (2013.01); *H01L 21/56* (2013.01); *H01L 21/568* (2013.01); *H01L 23/3128* (2013.01); *H01L 2224/04105* (2013.01); *H01L 2924/01322* (2013.01); *H01L 2924/12041* (2013.01); *H01L 2924/12042* (2013.01); *H01L 2924/12043* (2013.01); *H01L 2924/1306* (2013.01); *H01L 2924/13091* (2013.01); *H01L 2924/1461* (2013.01); *H01L 2924/181* (2013.01)

(58) Field of Classification Search
CPC ........ H01L 26/66; H01L 21/56; H01L 25/105; H01L 25/0657; H01L 2224/48091; H01L 2924/15311; H01L 2924/01079
USPC ....... 257/414, 686, 433, 434, 621, 667, 687, 257/723, 777, 778, 787, 790
See application file for complete search history.

(56) References Cited

U.S. PATENT DOCUMENTS

| 7,160,478 B2 | 1/2007 | Leib et al. |
|---|---|---|
| 7,790,505 B2 | 9/2010 | Lin et al. |

(Continued)

FOREIGN PATENT DOCUMENTS

CN   101371367   2/2009

*Primary Examiner* — Chuong A Luu
(74) *Attorney, Agent, or Firm* — Robert D. Atkins; Patent Law Group: Atkins and Associates, P.C.

(57) ABSTRACT

A semiconductor device has a semiconductor die and an encapsulant deposited over the semiconductor die. A conductive layer can be formed over the encapsulant and the semiconductor die. A transmissive layer can be formed over the semiconductor die. An interconnect structure can be formed through the encapsulant and electrically connected to the conductive layer, whereby the interconnect structure is formed off to only one side of the semiconductor die.

13 Claims, 20 Drawing Sheets

Related U.S. Application Data

(60) Provisional application No. 61/535,301, filed on Sep. 15, 2011.

(56) References Cited

U.S. PATENT DOCUMENTS

| | | |
|---|---|---|
| 7,919,410 B2 | 4/2011 | England et al. |
| 8,211,751 B2 | 7/2012 | Yamamoto et al. |
| 2002/0096753 A1* | 7/2002 | Tu et al. .................. 257/680 |
| 2005/0001331 A1 | 1/2005 | Kojima et al. |
| 2005/0253226 A1 | 11/2005 | Tian et al. |
| 2005/0285154 A1 | 12/2005 | Akram et al. |
| 2006/0065964 A1 | 3/2006 | Ohsumi |
| 2006/0087042 A1 | 4/2006 | Kameyama et al. |
| 2006/0102974 A1* | 5/2006 | Chen ........................ 257/433 |
| 2008/0083975 A1 | 4/2008 | Chao et al. |
| 2008/0179758 A1 | 7/2008 | Wong et al. |
| 2008/0224192 A1* | 9/2008 | England .............. H01L 21/6835 257/294 |
| 2008/0308928 A1 | 12/2008 | Chang et al. |
| 2009/0065923 A1 | 3/2009 | Chung |
| 2009/0090412 A1 | 4/2009 | Calwer et al. |
| 2010/0065948 A1 | 3/2010 | Bae et al. |
| 2010/0072618 A1 | 3/2010 | Camacho et al. |
| 2010/0140780 A1 | 6/2010 | Huang et al. |
| 2010/0171205 A1 | 7/2010 | Chen et al. |
| 2010/0237496 A1 | 9/2010 | Touzelbaev et al. |
| 2010/0244221 A1 | 9/2010 | Ko et al. |
| 2010/0320601 A1* | 12/2010 | Pagaila ............ H01L 21/76898 257/738 |
| 2011/0049662 A1 | 3/2011 | Camacho et al. |
| 2012/0161331 A1* | 6/2012 | Gonzalez ............... H01L 24/19 257/774 |
| 2012/0248626 A1 | 10/2012 | Lee et al. |

* cited by examiner

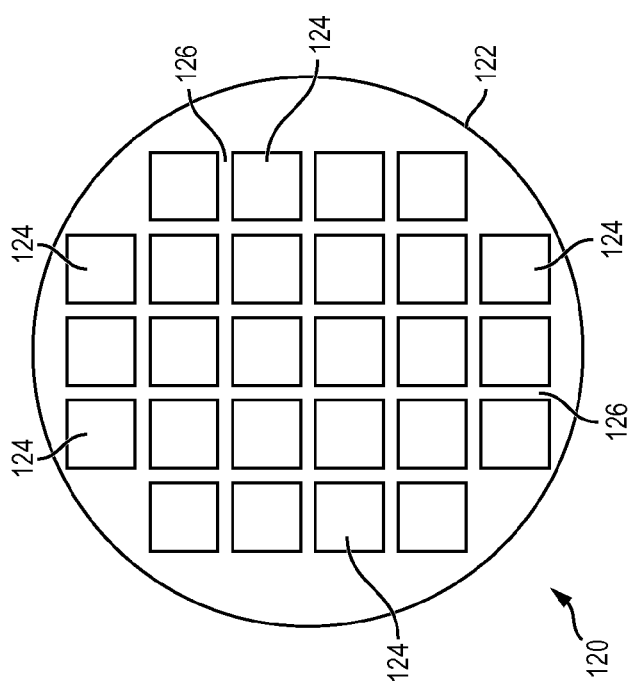
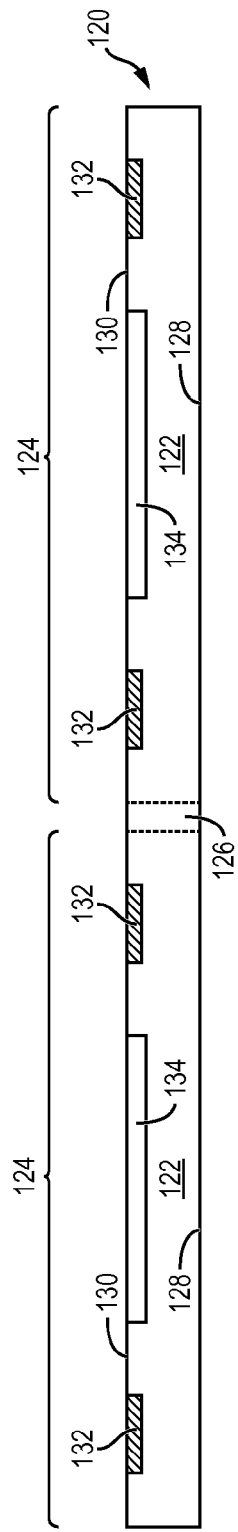

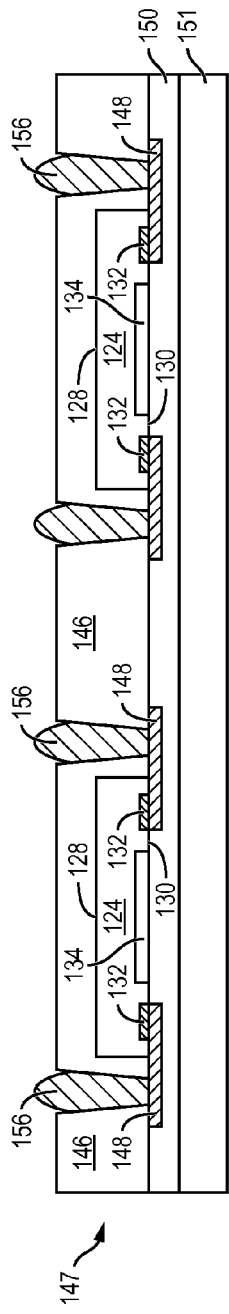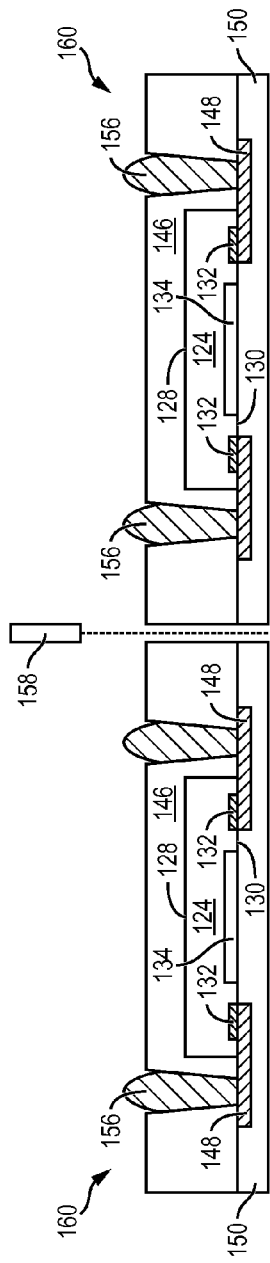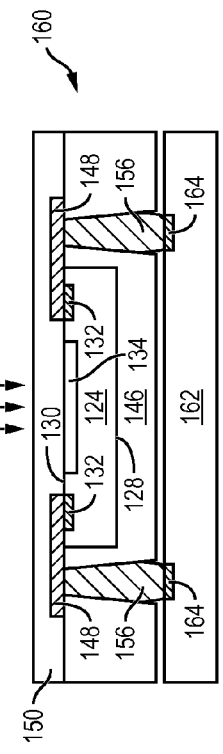

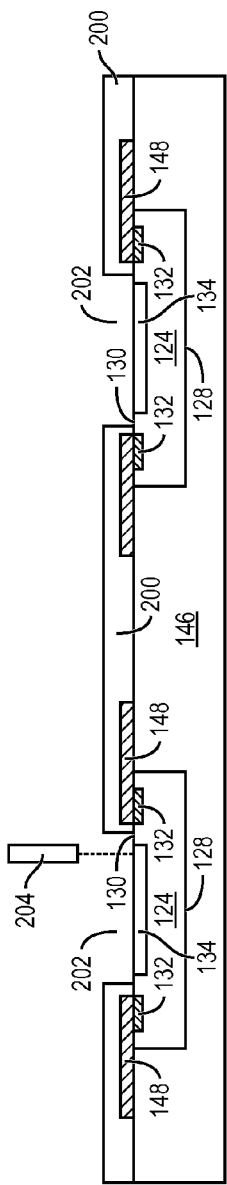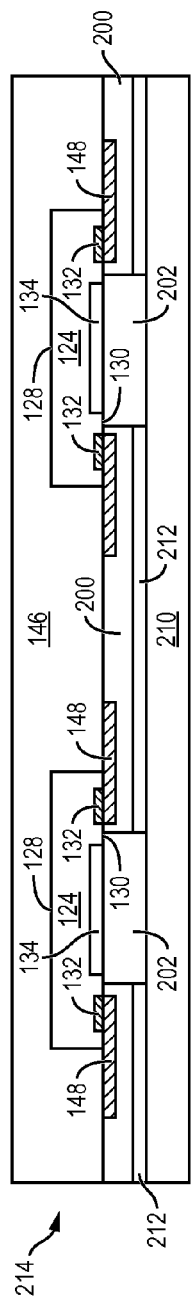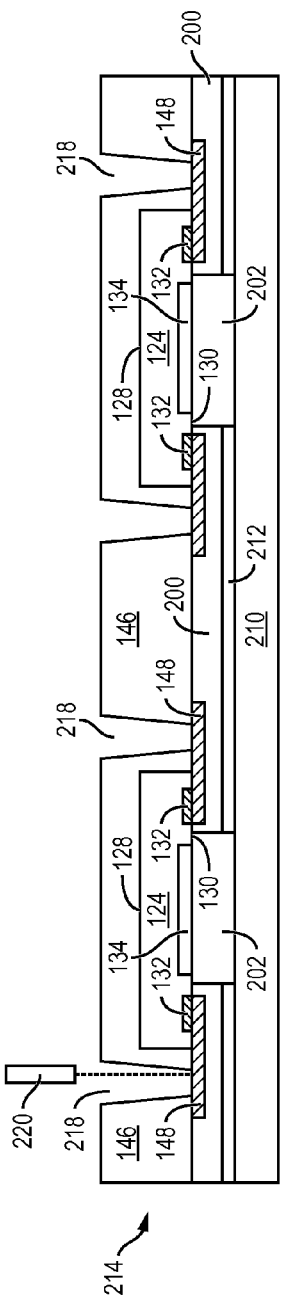

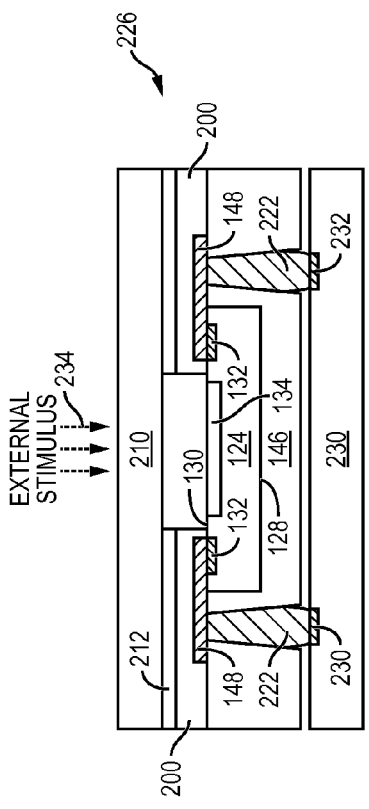
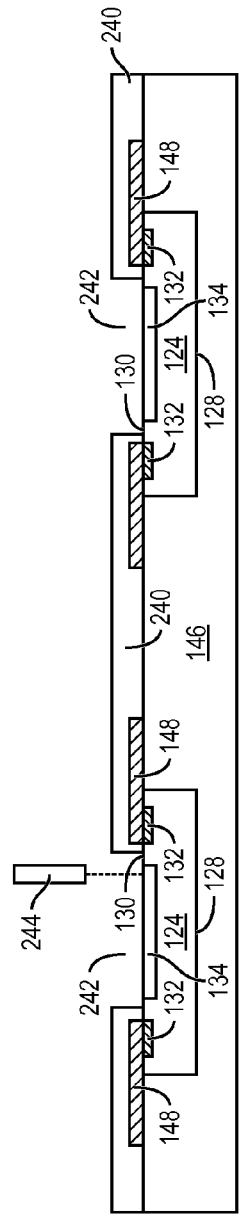
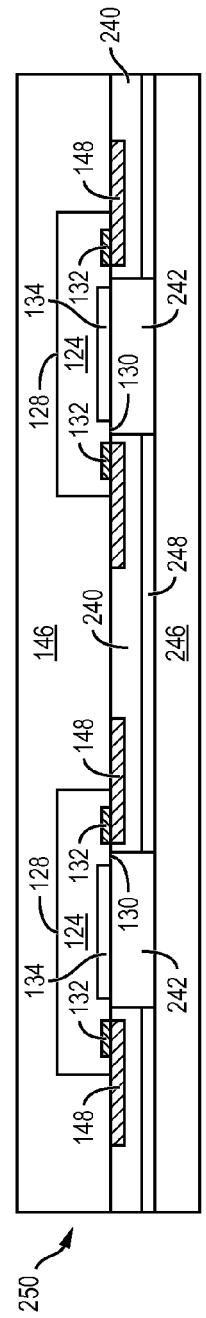
FIG. 9
FIG. 10a
FIG. 10b

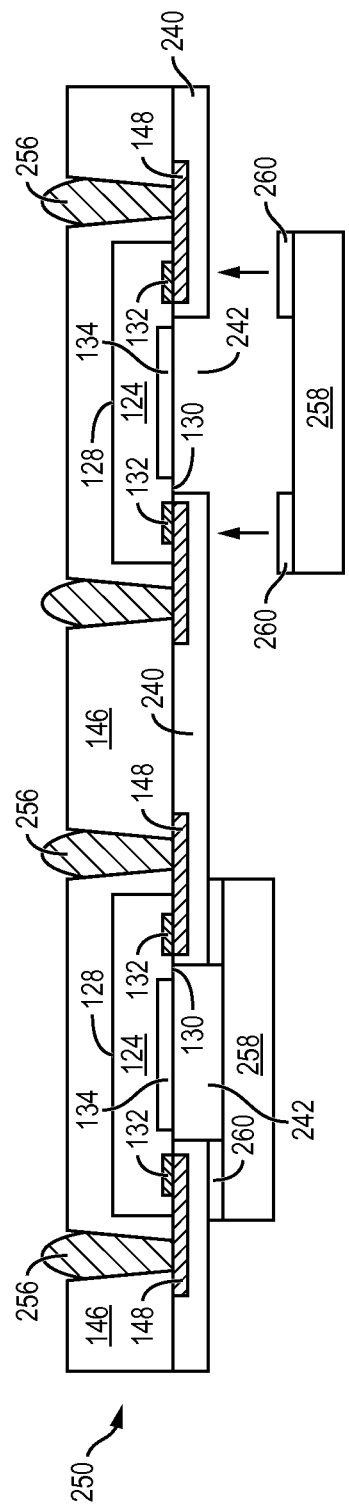
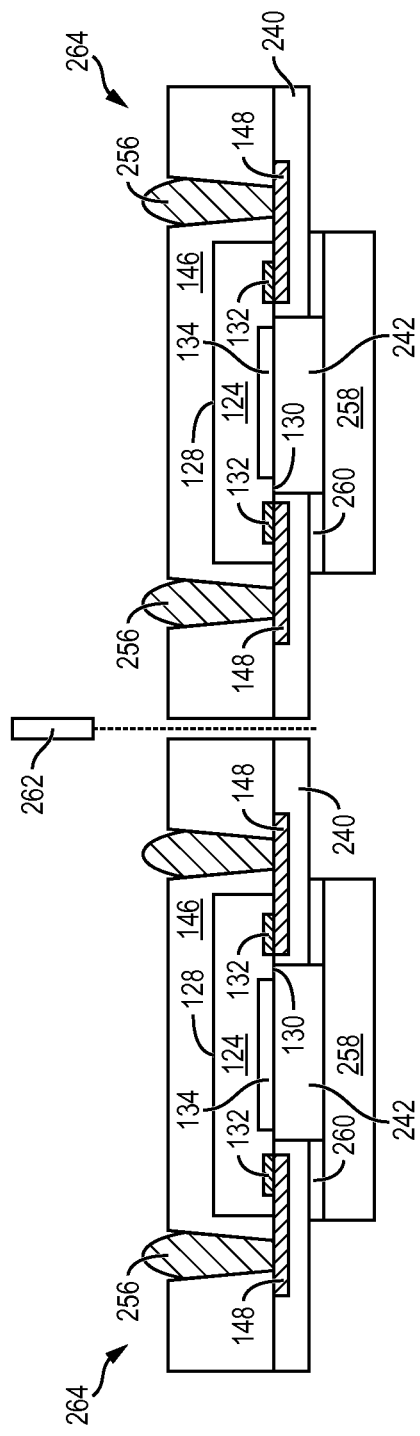
FIG. 10e
FIG. 10f

SEMICONDUCTOR DEVICE AND METHOD OF FORMING SEMICONDUCTOR DIE WITH ACTIVE REGION RESPONSIVE TO EXTERNAL STIMULUS

CLAIM OF DOMESTIC PRIORITY

The present application is a continuation-in-part of U.S. patent application Ser. No. 13/545,887, filed Jul. 10, 2012, which claims the benefit of Provisional Application No. 61/535,301, filed Sep. 15, 2011, which applications are incorporated herein by reference.

FIELD OF THE INVENTION

The present invention relates in general to semiconductor devices and, more particularly, to a semiconductor device and method of forming a semiconductor die having an active region responsive to an external stimulus.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die has an active surface containing analog or digital circuits implemented as active devices, passive devices, conductive layers, and dielectric layers formed within the die and electrically interconnected according to the electrical design and function of the die. The active surface performs the electrical and mechanical design function of the semiconductor die. The active surface may also contain a sensor such as a photodiode, phototransistor, Hall effect device, piezoelectric device, nanoelectronic device, and microelectromechanical device. The active surface responses to stimulus such as light, sound, heat, electromagnetic radiation, electric fields, magnetic fields, motion, ionizing radiation, vibration, motion, acceleration, rotation, pressure, and temperature to enable the semiconductor die to perform design functions. For example, an optical sensor on the active surface reacts to light which passes through an opening or window in the semiconductor package to reach the sensor.

SUMMARY OF THE INVENTION

A need exists for a cost effective semiconductor device having an active region that is responsive to an external stimulus. Accordingly, in one embodiment, a method of making a semiconductor device includes: providing a semiconductor die having an active region formed thereon, depositing an encapsulant over the semiconductor die, forming a conductive layer over the encapsulant and the semiconductor die, forming a transmissive layer over the semiconductor die and the active region, and forming a plurality of bumps through the encapsulant and electrically connected to the conductive layer, the plurality of bumps formed off to only one side of the semiconductor die.

In one embodiment, the active region is responsive to an external stimulus passing through the transmissive layer. In another embodiment, the active region of the semiconductor die includes a sensor. In some embodiments, the transmissive layer includes an optical dielectric material or an optical transparent or translucent material.

In one embodiment, the method of making the semiconductor device further includes: forming an insulating layer over the encapsulant, forming an opening in the insulating layer over the plurality of bumps, and depositing a conductive material in the opening. In another embodiment, the method further includes forming external interconnects on the conductive material.

In one embodiment, a method of making a semiconductor device includes: providing a first semiconductor die having an active region formed thereon, forming a first encapsulant around the first semiconductor die, depositing a conductive layer over the first encapsulant and the first semiconductor die, depositing a transmissive layer over the first semiconductor die including the active region, forming a plurality of bumps through the first encapsulant and electrically connected to the conductive layer, the plurality of bumps formed on only one side of the first semiconductor die, forming an opening in the transmissive layer over the active region of the first semiconductor die, and disposing a second semiconductor die in the opening over the first semiconductor die.

In one embodiment, the method of making the semiconductor device further includes: forming a second encapsulant around the second semiconductor die, and forming a second transmissive layer over the second semiconductor die. In another embodiment, the second semiconductor die is a sensor responsive to an external stimulus passing through the second transmissive layer. In some embodiments, the second transmissive layer includes an optical dielectric material or an optical transparent or translucent material.

A semiconductor device according one embodiment of the present disclosure includes: a first semiconductor die, a first encapsulant deposited over the first semiconductor die, a conductive layer formed over the first encapsulant and the first semiconductor die, a first transmissive layer formed over the first semiconductor die, and an interconnect structure formed through the first encapsulant and electrically connected to the conductive layer, whereby the interconnect structure is formed off to only one side of the first semiconductor die.

In some embodiments, the first transmissive layer includes an optical dielectric material or an optical transparent or translucent material. In other embodiments, the first semiconductor die includes an active region responsive to an external stimulus passing through the first transmissive layer. The active region can, for example, include a sensor.

In one embodiment, the semiconductor device further includes: an insulating layer formed over the first encapsulant, a first opening formed in the insulating layer over the interconnect structure, and a conductive material deposited in the first opening. In another embodiment, the semiconductor device further includes external interconnects formed on the conductive material.

In some embodiments, the first transmissive layer includes a cavity over the active region of the first semiconductor die, and further includes a second semiconductor die disposed in the cavity over the first semiconductor die. In other embodiments, a second encapsulant can be formed around the second semiconductor die, and a second transmissive layer can be formed over the second semiconductor die.

In some embodiments, the second transmissive layer can include an optical dielectric material or an optical transparent or translucent material. In other embodiments, the second semiconductor die can be a sensor responsive to an external stimulus passing through the second transmissive layer.

Other variations, embodiments and features of the present invention will become evident from the following detailed description, drawings and claims.

BRIEF DESCRIPTION OF THE DRAWINGS

FIGS. 3a-3d illustrate a semiconductor wafer with a plurality of semiconductor die separated by a saw street;

FIGS. 4a-4j illustrate a process of forming a transmissive layer over an eWLB;

FIG. 5 illustrates the eWLB with a transmissive layer formed over the semiconductor die;

FIGS. 8a-8e illustrate a process of forming a transmissive layer over a window in an insulating layer relative to an active region of a semiconductor die in an eWLB;

FIG. 9 illustrates the transmissive layer formed over the eWLB;

FIGS. 10a-10f illustrate another process of forming a transmissive layer over a window in an insulating layer relative to an active region of a semiconductor die in an eWLB;

DETAILED DESCRIPTION OF THE DRAWINGS

Figure 1:
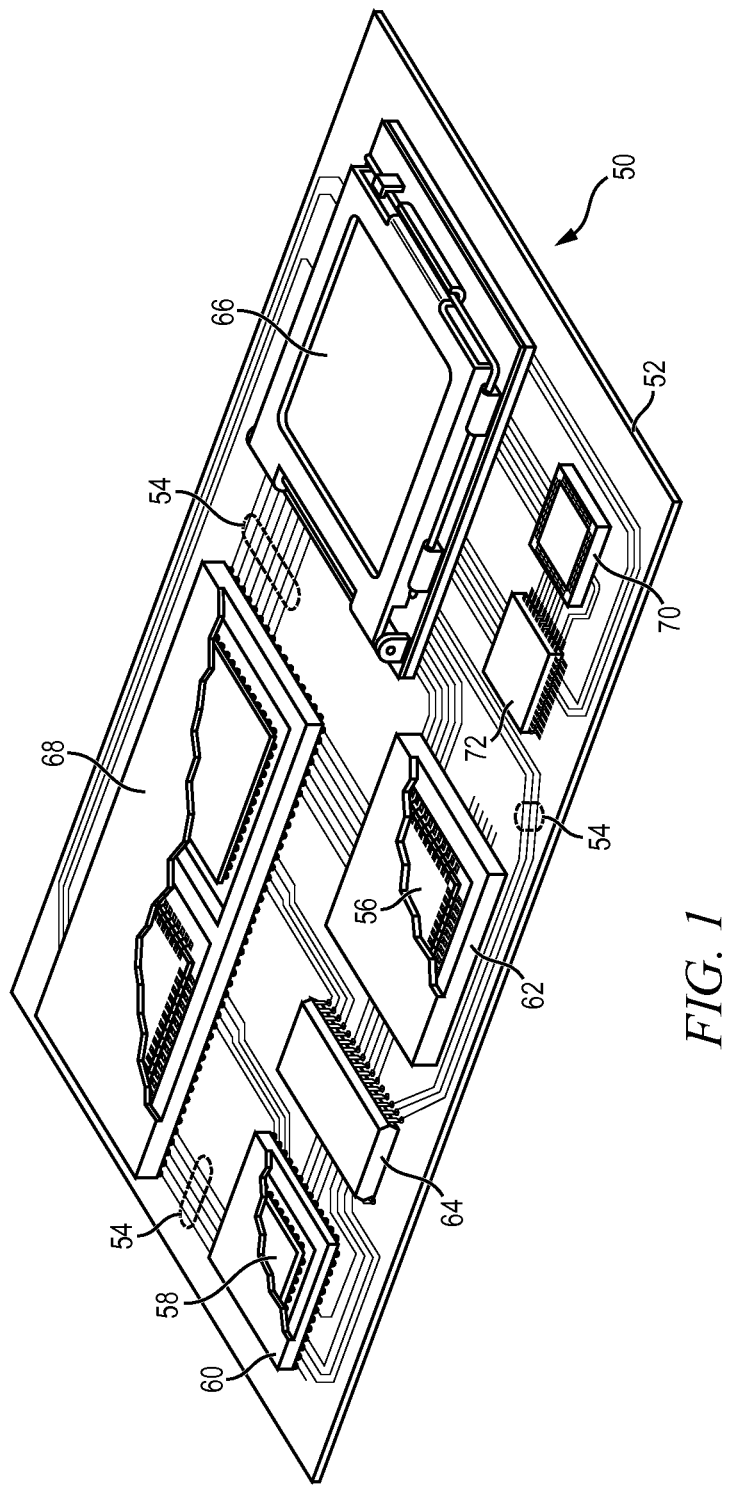
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
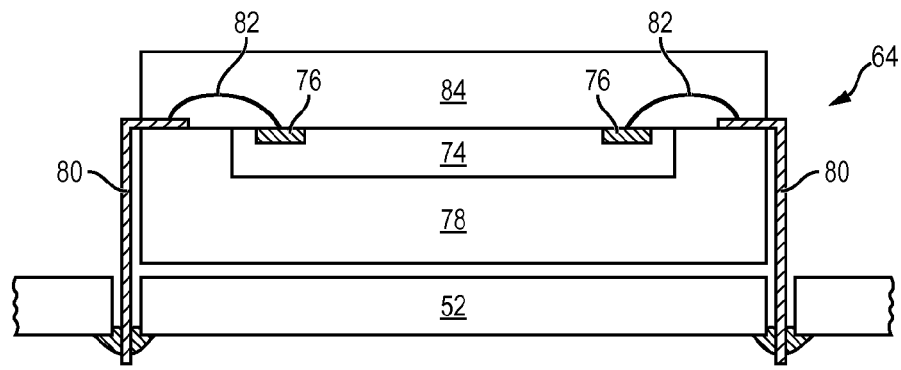
FIGS. 2a-2c illustrate further detail of the representative semiconductor packages mounted to the PCB.
Figure 2B:
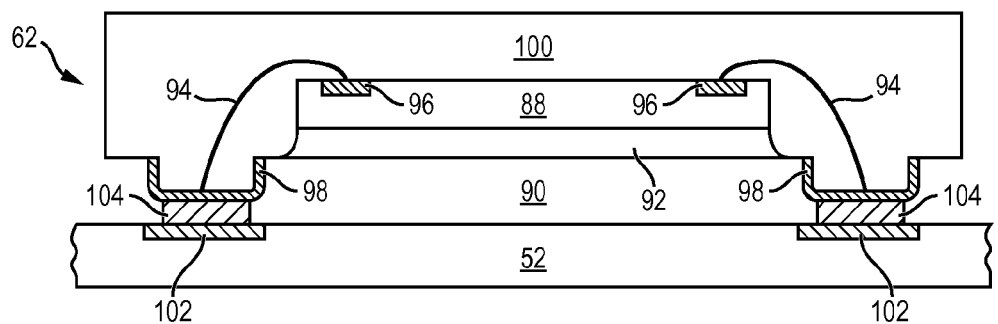
Figure 2C:
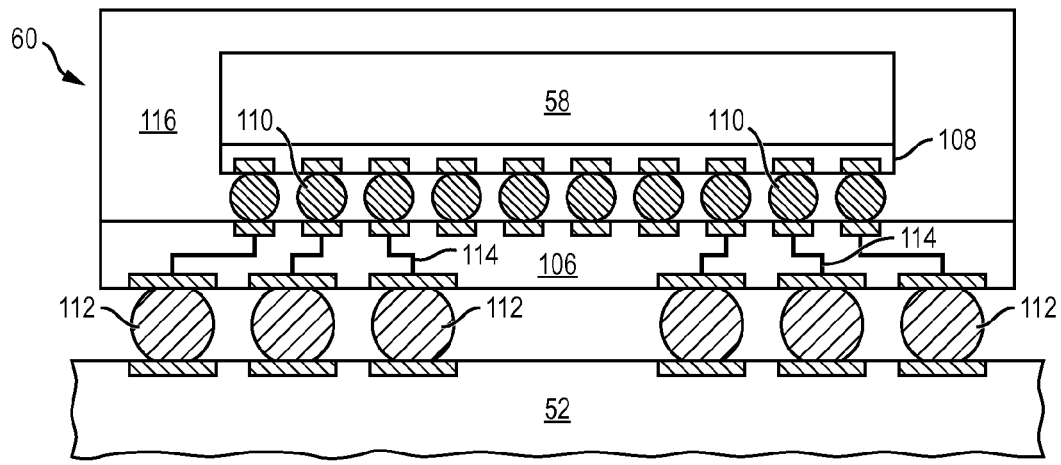

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126, as described above. Saw street 126 provides cutting areas to singulate semiconductor wafer 120 into individual semiconductor die 124.

FIG. 3*b* shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), application specific integrated circuit (ASIC), memory, or other signal processing circuit. Semiconductor die 124 may also contain integrated passive devices (IPDs), such as inductors, capacitors, and resistors, for RF signal processing.

An active region 134 is formed on active surface 130 of semiconductor die 124, typically during the front-end manufacturing process. In one embodiment, active region 134 contains analog and digital circuits. In another embodiment, active region 134 includes one or more active sensors, such as photodiode, phototransistor, and Hall effect device, having the ability to generate or control the flow of electrical current in response to an external stimulus. Alternatively, active region 134 includes one or more passive sensors, such as a photoresistor, thermistor, capacitive accelerometer, and load cell, having the ability to alter the relationship between voltage and current in response to the external stimulus. Active region 134 can also contain a piezoelectric device, nanoelectronic device, or microelectromechanical device. The external stimulus can be light, sound, electromagnetic radiation, electric field, magnetic field, ionizing radiation, vibration, motion, acceleration, rotation, orientation, pressure, and temperature. Active region 134 is electrically connected to other analog and digital circuits on active surface 130 to perform design functions of semiconductor die 124 in response to the external stimulus.

An electrically conductive layer 132 is formed on active surface 130 using PVD, CVD, electrolytic plating, electroless plating process, or other suitable deposition process. Conductive layer 132 can be one or more layers of Al, Cu, Sn, Ni, Au, Ag, or other suitable electrically conductive material. Conductive layer 132 operates as contact pads electrically connected to active region 134, as well as the analog and digital circuits formed on active surface 130. Conductive layer 132 can be formed as contact pads disposed side-by-side a first distance from the edge of semiconductor die 124, as shown in FIG. 3*b*. Alternatively, conductive layer 132 can be formed as contact pads that are in multiple rows such that a first row of contact pads is disposed a first distance from the edge of the die, and a second row of contact pads alternating with the first row is disposed a second distance from the edge of the die.

Figure 3C:
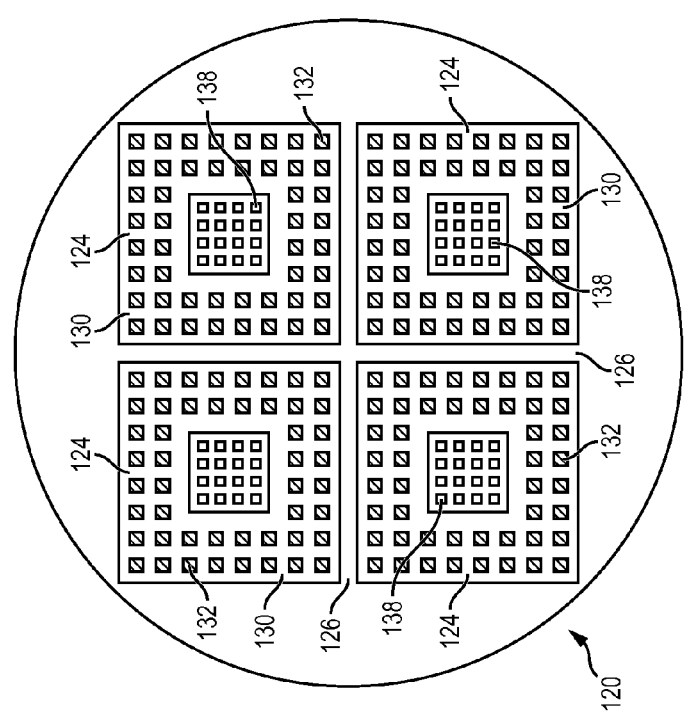

FIG. 3*c* shows a plan view of an example embodiment of semiconductor wafer 120 including a plurality of semiconductor die 124 each having active region 134 adapted to capture photographic images, such as in a digital camera. Active region 134 can include an array of light-sensitive sensors 138, such as photodiodes or phototransistors. Active region 134 may also include active devices, passive devices, and interconnect structures electrically connected to sensors 138 and providing the ability to control the accumulation and transmission of electrical signals from the sensors. Furthermore, active region 134 is electrically connected to analog and digital circuits within active surface 130, such as amplifiers, multiplexers, digital-to-analog converters (DAC), and analog-to-digital converters (ADC), providing the ability to electronically capture the signals from sensors 138. In another embodiment, active region 134 contains analog circuits, digital circuits, or devices responsive to an external stimulus.

Figure 3D:
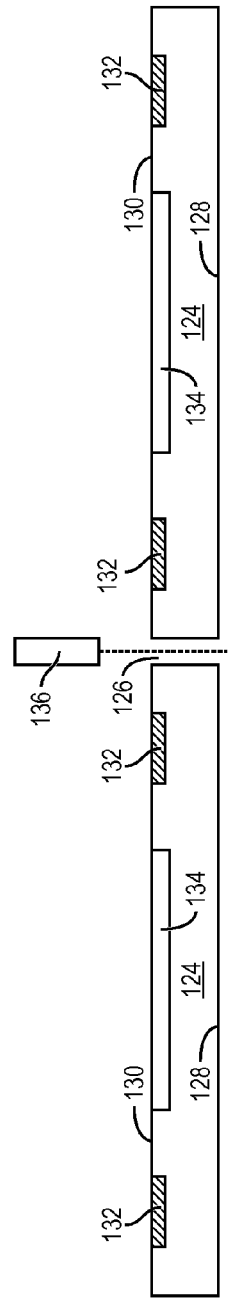

In FIG. 3*d*, semiconductor wafer 120 is singulated through saw street 126 using a saw blade or laser cutting tool 136 into individual semiconductor die 124. Alternatively, semiconductor wafer 120 can be singulated using back-grinding, stealth dicing, or scribing.

Figure 4A:
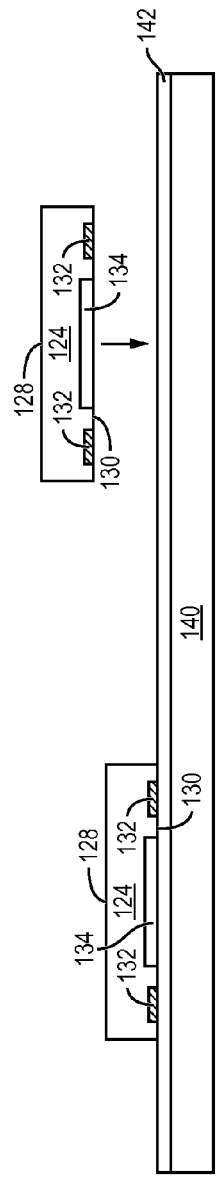

FIGS. 4*a*-4*j* illustrate, in relation to FIGS. 1 and 2*a*-2*c*, a process of forming a transmissive layer over an eWLB. FIG. 4*a* shows a cross-sectional view of a portion of a carrier or temporary substrate 140 containing sacrificial base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or thermal release layer. Semiconductor die 124 from FIG. 3*d* are mounted to interface layer 142 and carrier 140 using a pick and place operation with active surface 130 oriented toward the carrier.

Figure 4B:
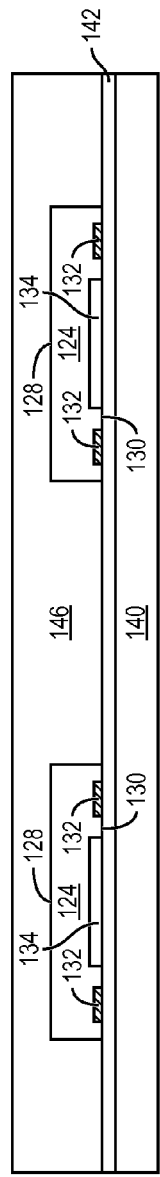

In FIG. 4*b*, an encapsulant or molding compound 146 is deposited over semiconductor die 124 and carrier 140 to form reconstituted wafer 147 using a paste printing, compressive molding, transfer molding, liquid encapsulant molding, vacuum lamination, spin coating, or other suitable application process. Encapsulant 146 can be polymer composite material, such as epoxy resin with filler, epoxy acrylate with filler, or polymer with proper filler. Encapsulant 146 is electrically non-conductive and environmentally protects the semiconductor device from external elements and contaminants.

Figure 4C:
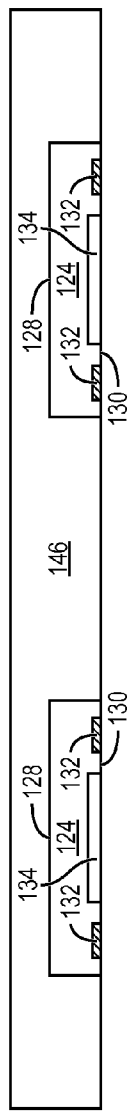

In FIG. 4*c*, carrier 140 and interface layer 142 are removed by chemical etching, mechanical peeling, chemical mechanical polishing (CMP), mechanical grinding, thermal bake, ultraviolet (UV) light, laser scanning, or wet stripping to expose semiconductor die 124, conductive layer 132, active region 134, and encapsulant 146.

Figure 4D:
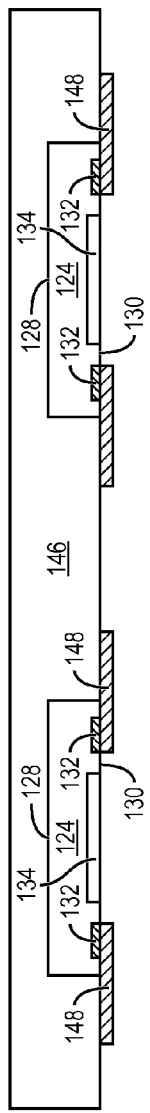

In FIG. 4*d*, an electrically conductive layer or redistribution layer (RDL) 148 is formed over semiconductor die 124 and encapsulant 146 using a patterning and deposition process such as sputtering, electrolytic plating, or electroless plating. Conductive layer 148 can be one or more layers of Al, Cu, Sn, Ni, Au, Ag, or other suitable electrically conductive material. Conductive layer 148 is electrically connected to conductive layer 132 of semiconductor die 124. Portions of conductive layer 148 can be electrically common or electrically isolated depending on the design and function of semiconductor die 124.

Figure 4E:
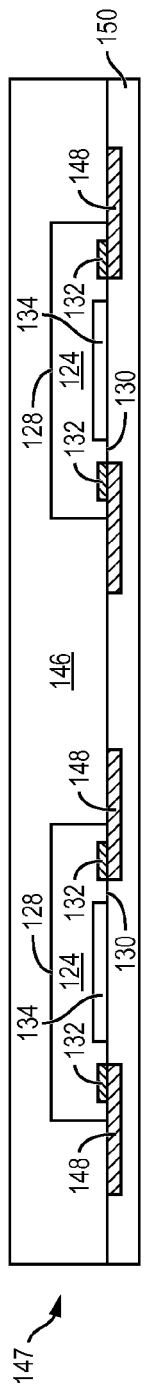

In FIG. 4*e*, a transmissive layer 150 is formed over encapsulant 146, conductive layer 148, and active surface 130, including active region 134. Transmissive layer 150 passes the external stimulus, e.g., sound, electromagnetic radiation, electric field, magnetic field, ionizing radiation, vibration, motion, acceleration, rotation, orientation, pressure, and temperature, to active surface 130 and active region 134. In one embodiment, transmissive layer 150 is an optically transparent or translucent dielectric material for passing light to active region 134. For example, transmissive layer 150 can be optical grade polyimide having a thickness of 10 micrometers (μm). Alternatively, transmissive layer is a dielectric material capable of passing other external stimulus. Transmissive layer 150 can be formed by PVD, CVD, lamination, printing, spin coating, spray coating, or other suitable deposition process.

Figure 4F:
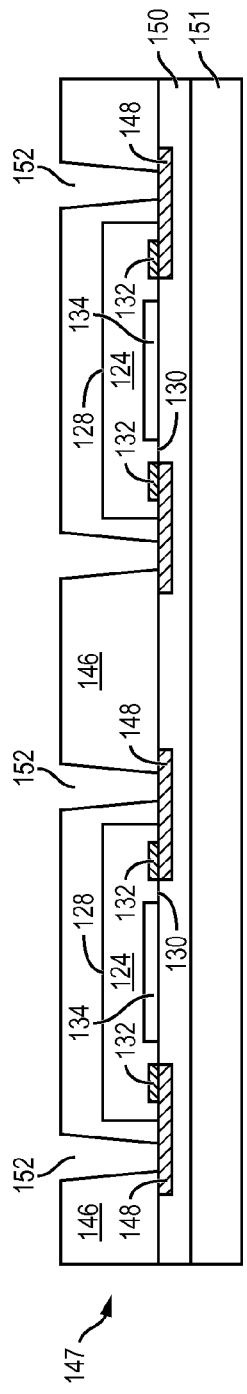
Figure 4G:
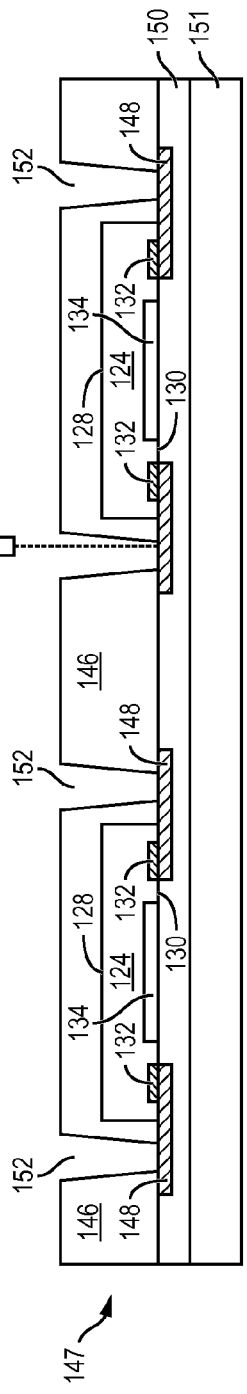

In FIG. 4f, semiconductor die 124 is optionally mounted with transmissive layer 150 oriented to a carrier or temporary substrate 151 containing sacrificial base material such as silicon, polymer, beryllium oxide, glass, or other suitable low-cost, rigid material for structural support. A portion of encapsulant 146 is removed by an etching process through a patterned photoresist layer to form openings 152 and expose conductive layer 148. The openings 152 can also be formed by laser direct ablation (LDA) using laser 154 to remove portions of encapsulant 146 and expose conductive layer 148, as shown in FIG. 4g.

In FIG. 4h, an electrically conductive bump material is deposited into openings 152 over the exposed conductive layer 148 using an evaporation, electrolytic plating, electroless plating, ball drop, or screen printing process. The bump material can include Al, Sn, Ni, Au, Ag, Pb, Bi, Cu, solder, and combinations thereof, with an optional flux solution. For example, the bump material can include eutectic Sn/Pb, high-lead solder, or lead-free solder. The bump material is bonded to conductive layer 148 using a suitable attachment or bonding process. In one embodiment, the bump material is reflowed by heating the material above its melting point to form balls or bumps 156. In some applications, bumps 156 are reflowed a second time to improve electrical contact to conductive layer 148. An under bump metallization (UBM) can be formed under bumps 156. Bumps 156 can also be compression bonded to conductive layer 148. Bumps 156 represent one type of interconnect structure that can be formed over conductive layer 148. The interconnect structure can also use stud bump, micro bump, or other electrical interconnect.

Figure 4I:
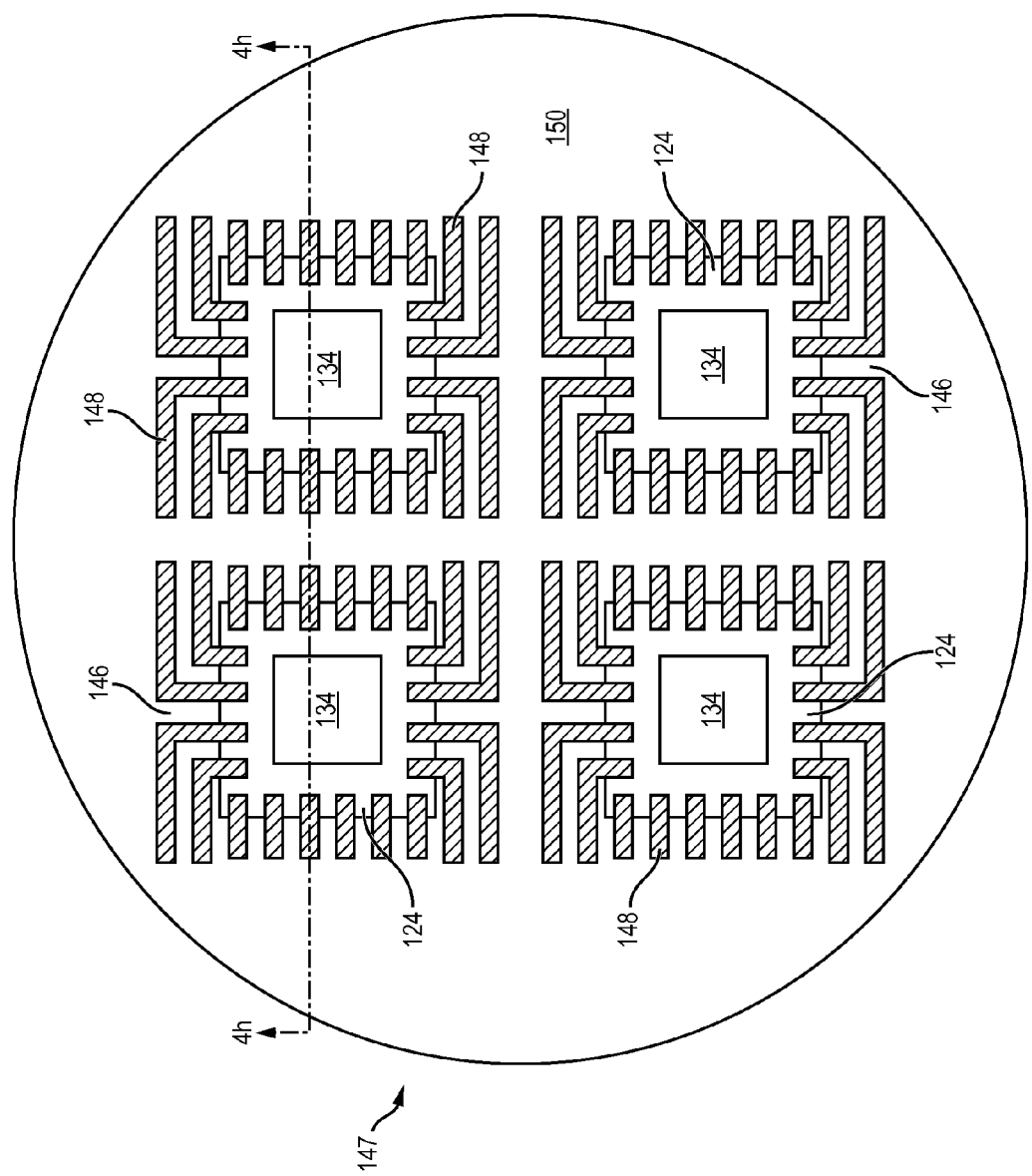

FIG. 4i shows a plan view of reconstituted wafer 147 as seen through transmissive layer 150. Reconstituted wafer 147 includes a plurality of semiconductor die 124 and encapsulant 146 formed around the semiconductor die. Each semiconductor die 124 includes active region 134. Conductive layer 148 is formed over semiconductor die 124 and encapsulant 146 and electrically connected to bumps 156. Transmissive layer 150 is formed over semiconductor die 124, encapsulant 146, and conductive layer 148.

In FIG. 4j, temporary carrier 151 is removed and reconstituted wafer 147 is singulated with saw blade or laser cutting tool 158 into separate embedded wafer level ball grid array (eWLB) packages 160.

FIG. 5 shows eWLB 160 mounted to substrate 162 with bumps 156 metallurgically and electrically connected to conductive layer 164. Active region 134 of semiconductor die 124 is oriented away from substrate 162 and receives an external stimulus 166 through transmissive layer 150. Active region 134 generates signals in response to external stimulus 166. The signals from active region 134 are processed by the analog and digital circuits within active surface 130 of semiconductor die 124. In one embodiment, active region 134 of eWLB 160 includes a sensor for a digital camera or cellular phone capable of receiving control signals through bumps 156 and outputting a digital image through the bumps. Active region 134 includes an array of photodiodes and semiconductor die 124 uses amplification, conversion, memory, and control circuitry to process the signals from active region 134. Semiconductor die 124 communicates with other components using conductive layer 132, conductive layer 148, bumps 156, and conductive layer 164. Communications between semiconductor die 124 and other components include the signals produced by active region 134 in response to external stimulus 166 and/or related to the operation of active region 134. The eWLB 160 has a lesser package thickness as compared to leadframe-based or laminate-based packages. Furthermore, eWLB 160 can be cost-effectively produced using wafer-level or panel-level manufacturing processes.

Figure 6A:
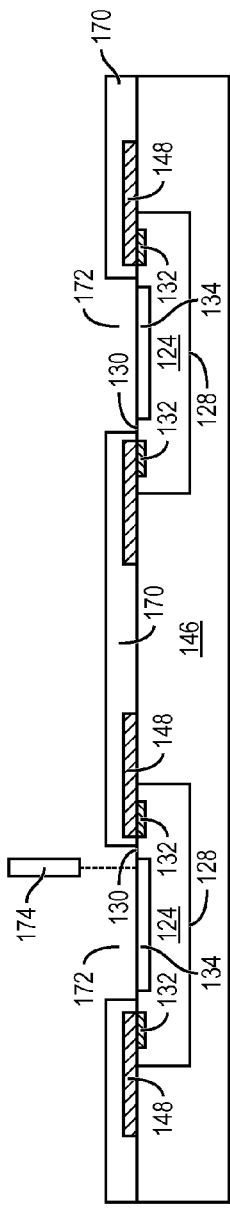
FIGS. 6a-6d illustrate a process of forming a window in an insulating layer over an active region of a semiconductor die in an eWLB.

FIGS. 6a-6d illustrate an embodiment of forming a window in an insulating layer over an active region of a semiconductor die in an eWLB. Continuing from FIG. 4d, an insulating or dielectric layer 170 is formed over encapsulant 146 and active surface 130 of semiconductor die 124 using PVD, CVD, printing, spin coating, spray coating, or other suitable deposition process, as shown in FIG. 6a. The insulating layer 170 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable insulating material. Alternatively, insulating layer 170 is a transmissive material, such as optical dielectric material, for passing the external stimulus to active surface 130. A portion of insulating layer 170 is removed by an etching process through a patterned photoresist layer to form an opening or window 172 and expose active region 134. Alternatively, window 172 is formed by LDA using laser 174 to expose active region 134.

Figure 6B:
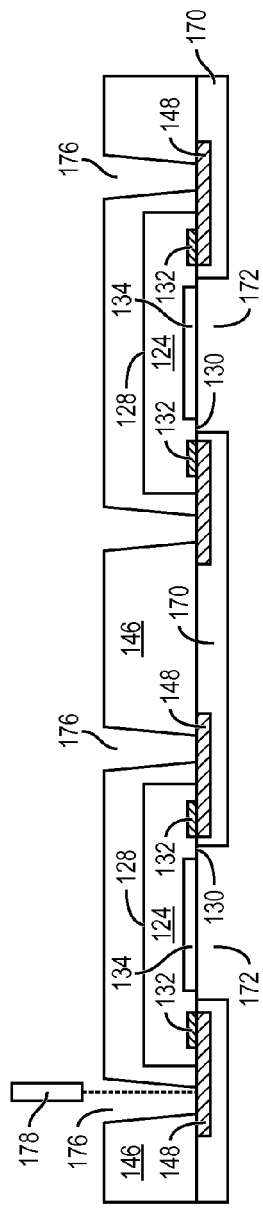

In FIG. 6b, a portion of encapsulant 146 is removed by an etching process through a patterned photoresist layer to form openings 176 and expose conductive layer 148. The openings 176 can also be formed by LDA using laser 178 to expose conductive layer 148.

Figure 6C:
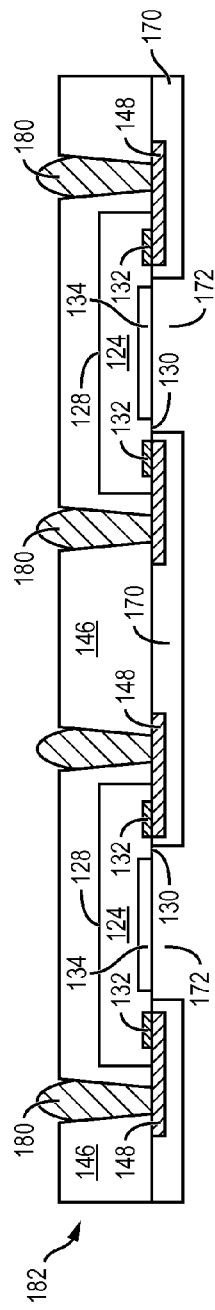

In FIG. 6c, an electrically conductive bump material is deposited into openings 176 over the exposed conductive layer 148 using an evaporation, electrolytic plating, electroless plating, ball drop, or screen printing process. The bump material can include Al, Sn, Ni, Au, Ag, Pb, Bi, Cu, solder, and combinations thereof, with an optional flux solution. For example, the bump material can include eutectic Sn/Pb, high-lead solder, or lead-free solder. The bump material is bonded to conductive layer 148 using a suitable attachment or bonding process. In one embodiment, the bump material is reflowed by heating the material above its melting point to form balls or bumps 180. In some applications, bumps 180 are reflowed a second time to improve electrical contact to conductive layer 148. A UBM layer can be formed under bumps 180. Bumps 180 can also be compression bonded to conductive layer 148. Bumps 180 represent one type of interconnect structure that can be formed over conductive layer 148. The interconnect structure can also use stud bump, micro bump, or other electrical interconnect.

Figure 6D:
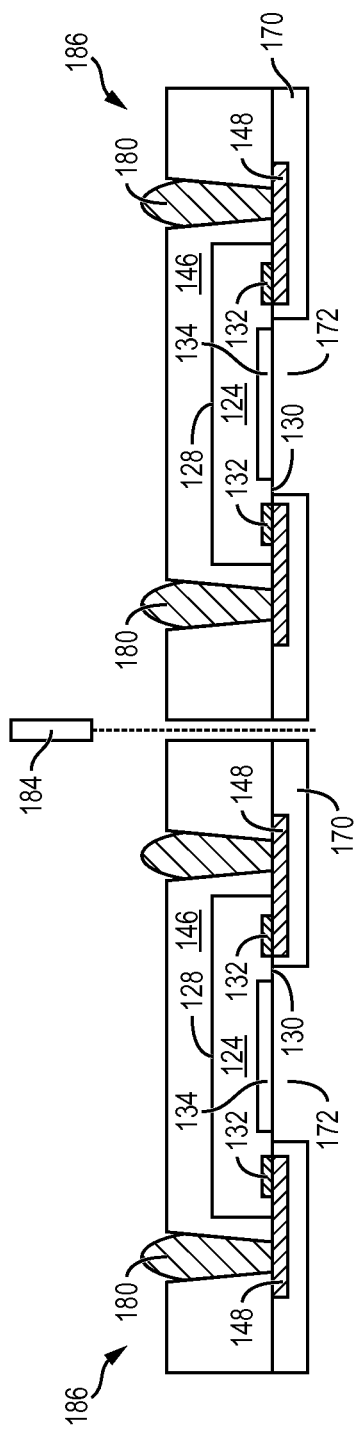

In FIG. 6d, reconstituted wafer 182 is singulated with saw blade or laser cutting tool 184 into separate eWLB 186.

Figure 7:
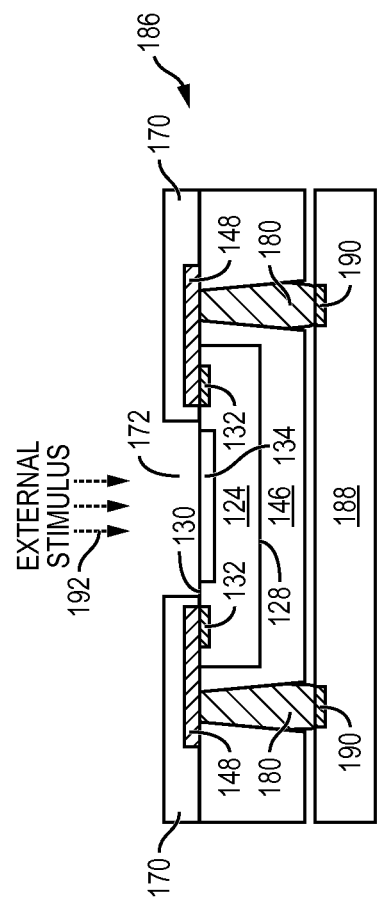
FIG. 7 illustrates the eWLB with the window in the insulating layer over the active region of the semiconductor die.

FIG. 7 shows eWLB 186 mounted to substrate 188 with bumps 180 metallurgically and electrically connected to conductive layer 190. Active region 134 of semiconductor die 124 is oriented away from substrate 188 and receives external stimulus 192 through window 172. Active region 134 generates signals in response to external stimulus 192. In one embodiment, the signals from active region 134 are processed by analog and digital circuits within semiconductor die 124. Semiconductor die 124 communicates with other components using conductive layer 132, conductive layer 148, bumps 180, and conductive layer 190. The eWLB 186 has a lesser package thickness as compared to leadframe-based or laminate-based packages. Furthermore, eWLB 186 can be cost-effectively produced using wafer-level or panel-level manufacturing processes.

Figure 8D:
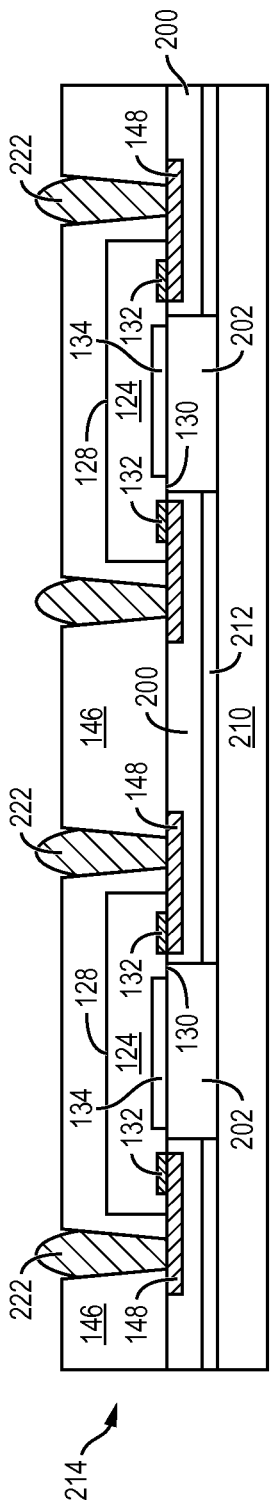

FIGS. 8a-8e illustrate a process of forming a transmissive layer over a window in an insulating layer relative to an active region of a semiconductor die in an eWLB. Continuing from FIG. 4d, an insulating or dielectric layer 200 is formed over encapsulant 146 and active surface 130 of semiconductor die 124 using PVD, CVD, printing, spin coating, spray coating, or other suitable deposition process, as shown in FIG. 8a. The insulating layer 200 contains one or more layers of SiO2, Si3N4, SiON, Ta2O5, Al2O3, HfO2, BCB, PI, PBO, or other suitable insulating material. Alternatively, insulating layer 200 is a transmissive material, such as optical dielectric material, for passing the external stimulus to active surface 130. A portion of insulating layer 200 is removed by an etching process through a patterned photoresist layer to form an opening or window 202 and expose active region 134. Alternatively, window 202 is formed by LDA using laser 204 to expose active region 134.

FIG. 8b shows transmissive layer 210 containing a material selected to pass an external stimulus to active region 134. For example, transmissive layer 210 includes glass, quartz, optical dielectric material, or other optically transparent or translucent material. An interface layer or double-sided tape 212 is formed over transmissive layer 210 as an adhesive bonding film. Alternatively, interface layer 212 is formed over insulating layer 200. Transmissive layer 210 is mounted over reconstituted wafer 214 and secured by interface layer 212.

In FIG. 8c, a portion of encapsulant 146 is removed by an etching process through a patterned photoresist layer to form openings 218 and expose conductive layer 148. The openings 218 can also be formed by LDA using laser 220 to expose conductive layer 148.

In FIG. 8d, an electrically conductive bump material is deposited into openings 218 over the exposed conductive layer 148 using an evaporation, electrolytic plating, electroless plating, ball drop, or screen printing process. The bump material can include Al, Sn, Ni, Au, Ag, Pb, Bi, Cu, solder, and combinations thereof, with an optional flux solution. For example, the bump material can include eutectic Sn/Pb, high-lead solder, or lead-free solder. The bump material is bonded to conductive layer 148 using a suitable attachment or bonding process. In one embodiment, the bump material is reflowed by heating the material above its melting point to form balls or bumps 222. In some applications, bumps 222 are reflowed a second time to improve electrical contact to conductive layer 148. A UBM layer can be formed under bumps 222. Bumps 222 can also be compression bonded to conductive layer 148. Bumps 222 represent one type of interconnect structure that can be formed over conductive layer 148. The interconnect structure can also use stud bump, micro bump, or other electrical interconnect.

Figure 8E:
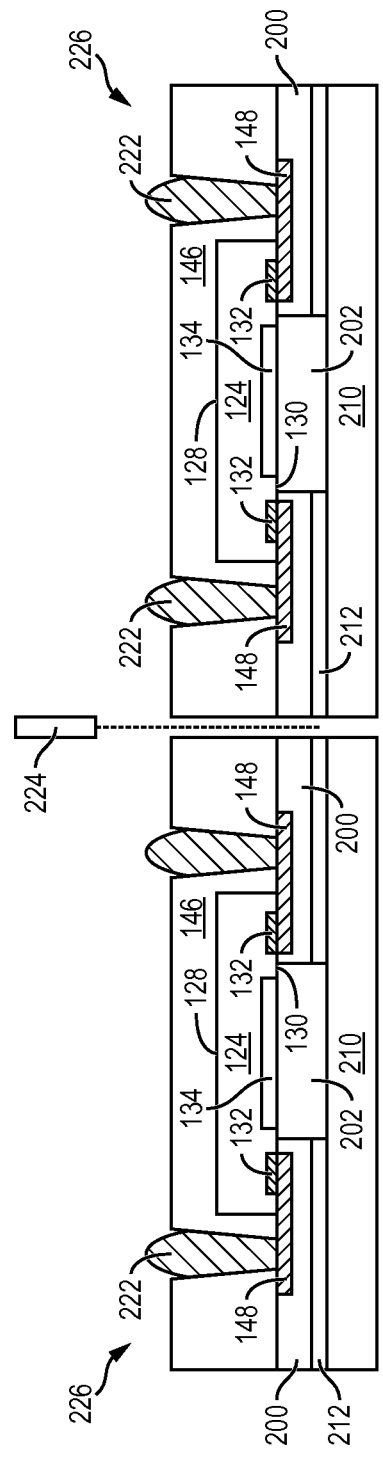

In FIG. 8e, reconstituted wafer 214 is singulated with saw blade or laser cutting tool 224 into separate eWLB 226.

FIG. 9 shows eWLB 226 mounted to substrate 230 with bumps 222 metallurgically and electrically connected to conductive layer 232. Active region 134 of semiconductor die 124 is oriented away from substrate 230 and receives external stimulus 234 through transmissive layer 210 and window 202. Active region 134 generates signals in response to external stimulus 234. The signals from active region 134 are processed by analog and digital circuits within semiconductor die 124. Semiconductor die 124 communicates with other components using conductive layer 132, conductive layer 148, bumps 222, and conductive layer 232. The eWLB 226 has a lesser package thickness as compared to leadframe-based or laminate-based packages. Furthermore, eWLB 226 can be cost-effectively produced using wafer-level or panel-level manufacturing processes.

Figure 10C:
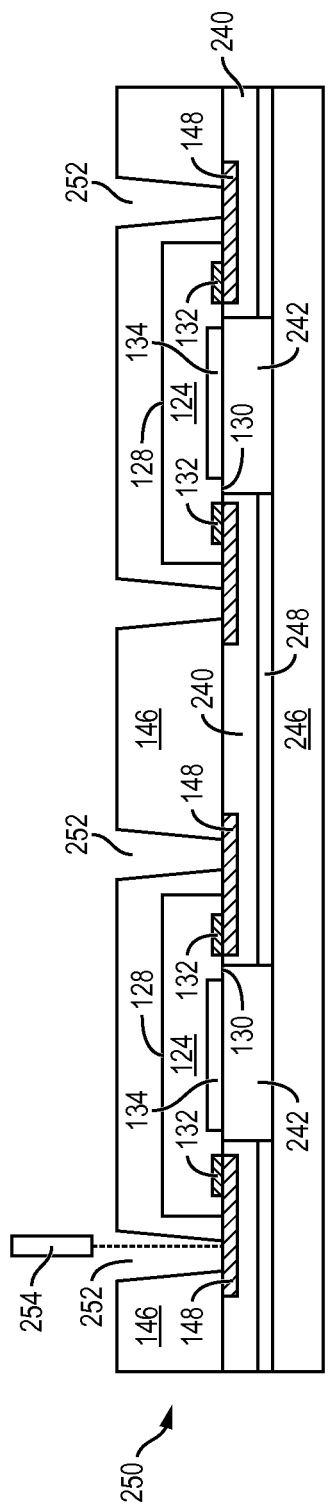

FIGS. 10a-10f illustrate another process of forming a transmissive layer over a window in an insulating layer relative to an active region of a semiconductor die in an eWLB. Continuing from FIG. 4d, an insulating or dielectric layer 240 is formed over encapsulant 146 and active surface 130 of semiconductor die 124 using PVD, CVD, printing, spin coating, spray coating, or other suitable deposition process, as shown in FIG. 10a. The insulating layer 240 contains one or more layers of SiO2, Si3N4, SiON, Ta2O5, Al2O3, HfO2, BCB, PI, PBO, or other suitable insulating material. Alternatively, insulating layer 240 is a transmissive material, such as optical dielectric material, for passing the external stimulus to active surface 130. A portion of insulating layer 240 is removed by an etching process through a patterned photoresist layer to form an opening or window 242 and expose active region 134. Alternatively, window 242 is formed by LDA using laser 244 to expose active region 134.

FIG. 10b shows substrate or carrier 246 containing temporary or sacrificial base material such as silicon, polymer, beryllium oxide, or other suitable low-cost, rigid material for structural support. An interface layer or double-sided tape 248 is formed over carrier 246 as a temporary adhesive bonding film or etch-stop layer. Leading with insulating layer 240 and window 242, reconstituted wafer 250 is mounted to interface layer 248 over carrier 246.

In FIG. 10c, a portion of encapsulant 146 is removed by an etching process through a patterned photoresist layer to form openings 252 and expose conductive layer 148. The openings 252 can also be formed by LDA using laser 254 to expose conductive layer 148.

Figure 10D:
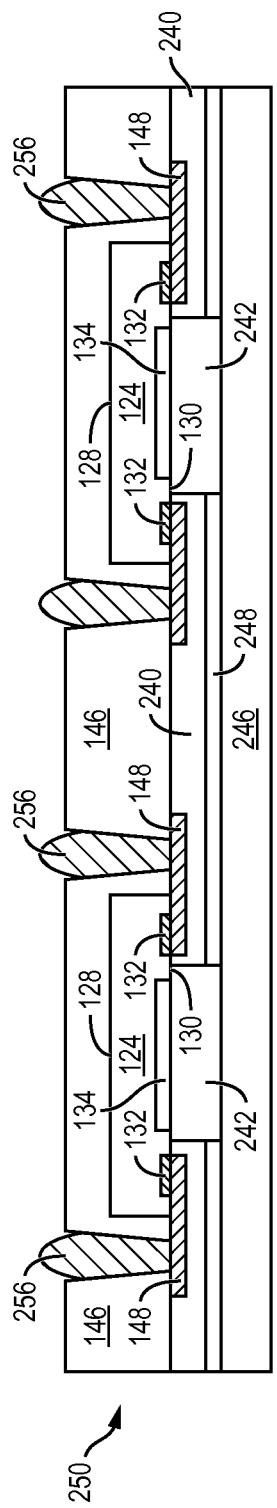

In FIG. 10d, an electrically conductive bump material is deposited into openings 252 over the exposed conductive layer 148 using an evaporation, electrolytic plating, electroless plating, ball drop, or screen printing process. The bump material can include Al, Sn, Ni, Au, Ag, Pb, Bi, Cu, solder, and combinations thereof, with an optional flux solution. For example, the bump material can include eutectic Sn/Pb, high-lead solder, or lead-free solder. The bump material is bonded to conductive layer 148 using a suitable attachment or bonding process. In one embodiment, the bump material is reflowed by heating the material above its melting point to form balls or bumps 256. In some applications, bumps 256 are reflowed a second time to improve electrical contact to conductive layer 148. A UBM can be formed under bumps 256. Bumps 256 can also be compression bonded to conductive layer 148. Bumps 256 represent one type of interconnect structure that can be formed over conductive layer 148. The interconnect structure can also use stud bump, micro bump, or other electrical interconnect.

In FIG. 10e, carrier 246 and interface layer 248 are removed by chemical etching, mechanical peeling, CMP, mechanical grinding, thermal bake, UV light, laser scanning, or wet stripping to expose insulating layer 240.

Transmissive layer 258 contains a material such as glass, quartz, optical dielectric material, optical transparent or translucent material, or other suitable material selected to pass an external stimulus to active region 134. An interface layer or double-sided tape 260 is formed over transmissive layer 258 as an adhesive bonding film. Transmissive layer 258 is mounted over window 242 and active region 134 of reconstituted wafer 250. Alternatively, interface layer 260 is formed over insulating layer 240 around window 242 and transmissive layer 258 is mounted to interface layer 260 over active region 134.

In FIG. 10f, reconstituted wafer 250 is singulated with saw blade or laser cutting tool 262 into separate eWLB 264.

Figure 11A:
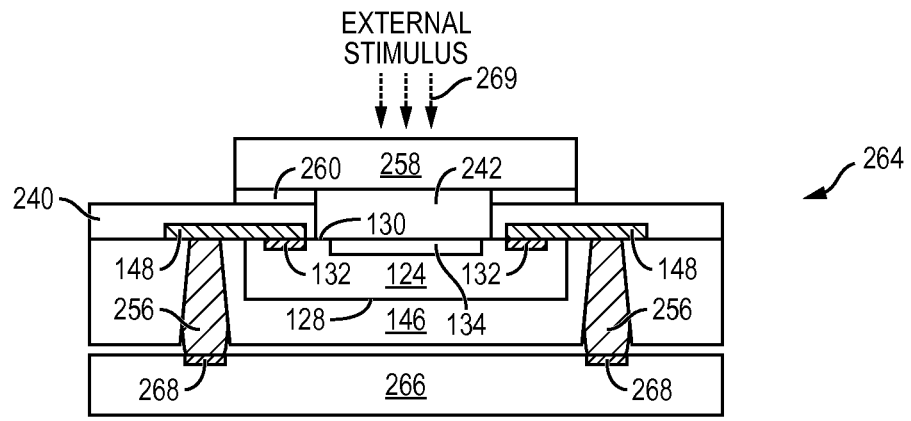
FIGS. 11a-11b illustrate the transmissive layer formed over the eWLB according to FIGS. 10a-10f.
Figure 11B:
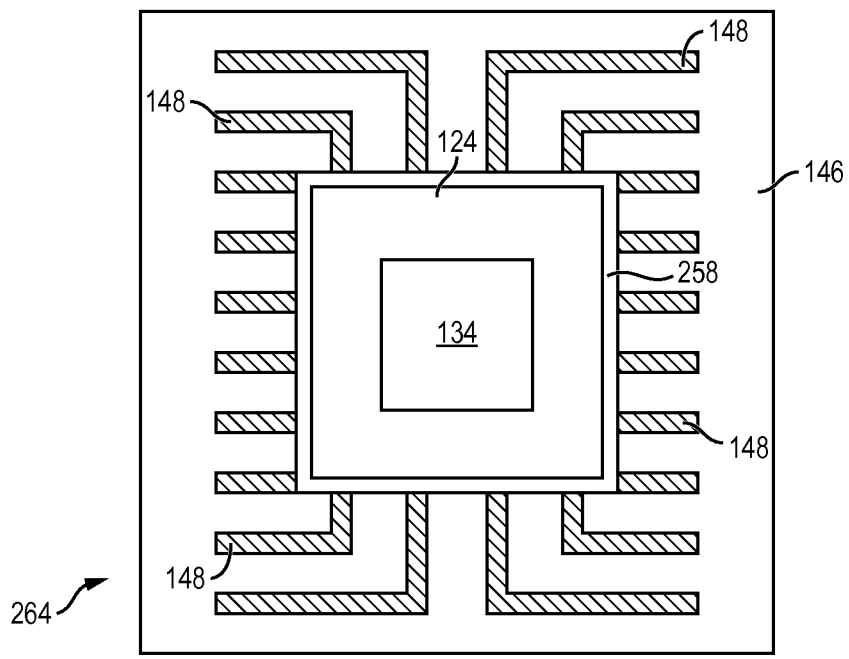

FIG. 11a shows a cross-sectional view of eWLB 264 mounted to substrate 266 with bumps 256 metallurgically and electrically connected to conductive layer 268. FIG. 11b shows a plan view of eWLB 264 as seen through transmissive layer 258. Active region 134 of semiconductor die 124 is oriented away from substrate 266 and receives external stimulus 269 through transmissive layer 258 and window 242. Active region 134 generates signals in response to external stimulus 269. The signals from active region 134 are processed by analog and digital circuits within semiconductor die 124. Semiconductor die 124 communicates with other components using conductive layer 132, conductive layer 148, bumps 256, and conductive layer 268. The eWLB 264 has a lesser package thickness as compared to leadframe-based or laminate-based packages. Furthermore, eWLB 264 can be cost-effectively produced using wafer-level or panel-level manufacturing processes.

Figure 12A:
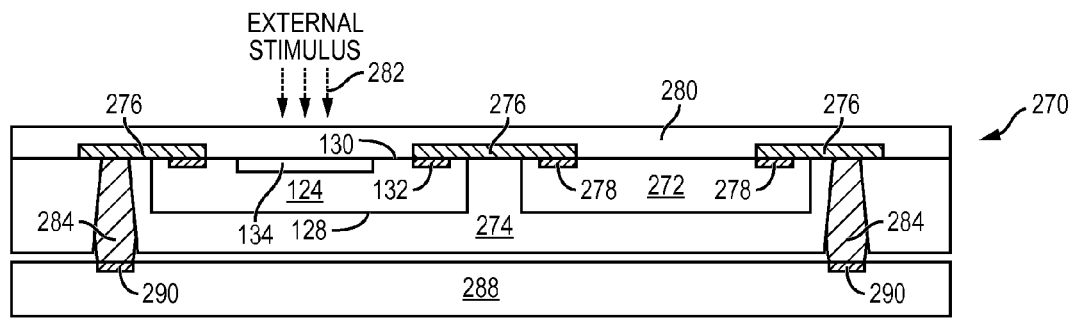
FIGS. 12a-12b illustrate an eWLB with two adjacent semiconductor die.

FIG. 12a illustrates another embodiment of eWLB 270, similar to FIG. 5, with semiconductor die 272 disposed adjacent to semiconductor die 124. An encapsulant 274 is deposited over semiconductor die 124 and 272, similar to FIG. 4b. Conductive layer or RDL 276 is formed over semiconductor die 124 and 272 and encapsulant 274 and electrically connected to conductive layers 132 and 278. Transmissive layer 280 is formed over semiconductor die 124 and 272 to pass external stimulus 282 to active region 134. A portion of encapsulant 274 is removed and bumps 284 are formed in the openings. The eWLB 270 is mounted to substrate 288 with bumps 284 electrically connected to conductive layer 290.

Figure 12B:
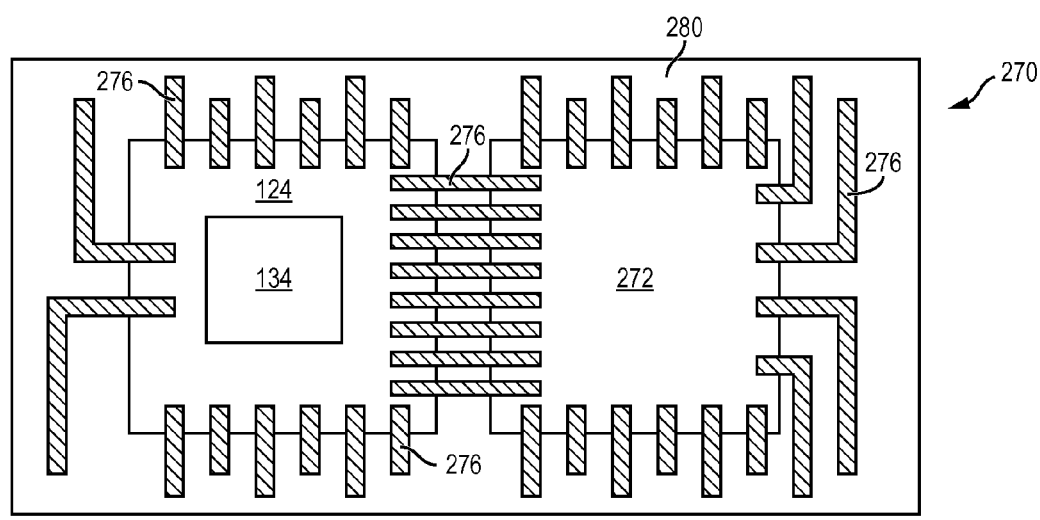

FIG. 12b shows a plan view of eWLB 270 through transmissive layer 280. Active region 134 of semiconductor die 124 receives external stimulus 282 through transmissive layer 280. Active region 134 generates signals in response to external stimulus 282. The signals from active region 134 are processed by the analog and digital circuits within semiconductor die 124 and 272. In one embodiment, semiconductor die 272 is an ASIC, DSP, or memory device. The eWLB 270 has a lesser package thickness as compared to leadframe-based or laminate-based packages. Furthermore, eWLB 270 can be cost-effectively produced using wafer-level or panel-level manufacturing processes.

Figure 13A:
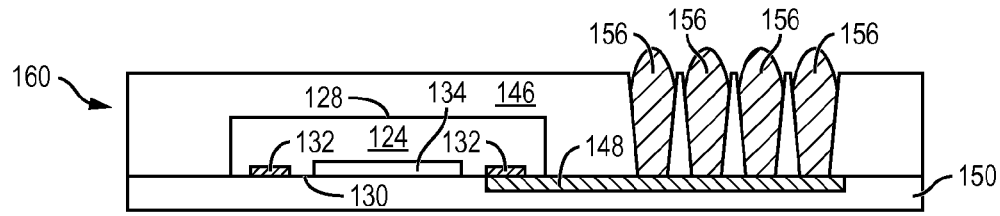
FIGS. 13a-13d illustrate a process of forming a transmissive layer over an eWLB.

FIG. 13a illustrates an eWLB 160 according to another embodiment of the present disclosure, the eWLB 160 being similar to FIG. 4j with a semiconductor die 124 having a back surface 128 and an active surface 130 with conductive layers 132 and an active region 134 formed thereon. These various components of the semiconductor die 124 can be formed using similar materials and techniques as those discussed above and will not be elaborated further herein. Similar to above, an encapsulant 146 may be deposited over the semiconductor die 124 followed by a conductive layer 148 being formed over the encapsulant 146 and the semiconductor die 124. Subsequently, a transmissive layer 150 may be formed over the semiconductor die 124 and the active region 134. Next, a plurality of bumps 156 may be formed by photolithography, etching and plating through the encapsulant 146, the plurality of bumps 156 being electrically connected to the conductive layer 148. The bumps 156 can also be formed by other suitable deposition techniques as discussed above.

In this embodiment, the plurality of bumps 156 may be formed off to only one side of the semiconductor die 124 as shown in the figure. The plurality of bumps 156 may be clustered off to the right-hand side of the semiconductor die 124 although it will be understood that the plurality of bumps 156 can also be formed off to only the left-hand side of the semiconductor die 124. Although the methods and materials of forming the bumps 156 have been discussed above, it will be appreciated by one skilled in the art that the bumps 156 need not be limited to those formed by laser ablation or other etching techniques as disclosed above but may also include other types of electrical interconnects including without limitation pre-formed electrical interconnects. The bumps 156 may be, for example, pre-formed vias including the likes of silicon vias, glass vias or PCB vias, among others, the pre-formation being customizable to allow for the semiconductor die 124 to be mounted adjacent such vias or bumps 156. In other words, the vias or bumps 156 can be pre-manufactured ahead of time on a suitable medium or substrate or package carrier, and the semiconductor die 124 can subsequently be mounted adjacent the pre-formed vias or bumps 156 in a plug-and-play type of manufacturing configuration.

The clustering of bumps 156 in this embodiment is able to function as a high density via block by routing signals from the front of the semiconductor die 124 to the back of the eWLB 160. In one embodiment, the number of bumps 156 that can be clustered is about 20 or so, although the number of bumps 156 can be less than or more than 20 as can be appreciated by one skilled in the art. The eWLB 160 can be optical, electrical or electromechanical packages, among other types of packages including without limitation fingerprint sensors, sensor chips or MEMS. In some embodiments, the eWLB 160 may also be used as intelligent memory or logic chips for televisions and cameras, among other types of electronic devices. In other embodiments, the eWLB 160 can respond to tactile or other physical stimulus from a human body including without limitation fingers, thumbs or palms.

Like above, the active region 134 can be responsive to an external stimulus passing through the transmissive layer 150. In one embodiment, the active region 134 of the semiconductor die 124 can include a sensor for receiving and responding to such external stimulus. The types of external stimulus that can be passed through the transmissive layer 150 include without limitation tactile responses, optical sensing, capacitive and RF sensing, among others. Similar to above, the transmissive layer 150 can include an optical dielectric material or an optical transparent or translucent material.

Figure 13B:
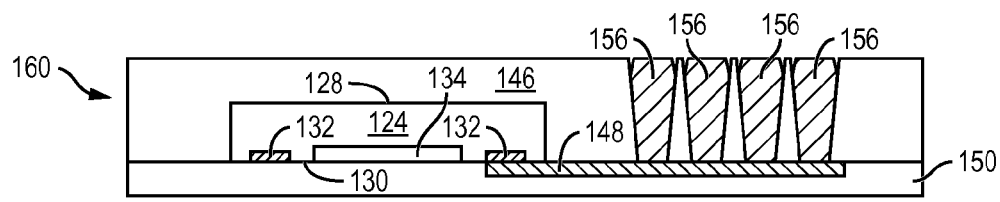

FIG. 13b shows the next step in processing the eWLB 160 from FIG. 13a by planarizing or leveling the plurality of bump 156. This can be accomplished by chemical mechanical polishing (CMP) or grinding or reflowing the bumps 156. This can also be accomplished by other suitable planarizing techniques as can be appreciated by one skilled in the art.

Figure 13C:
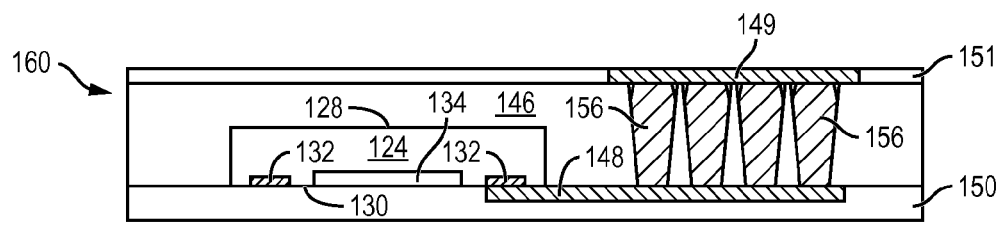

FIG. 13c shows the next step in processing the eWLB 160 from FIG. 13b after the planarization step. In one embodiment, similar to the steps in FIGS. 6a-6d, an insulating layer 151 may be formed over the encapsulant 146 followed by an opening (not shown) formed therein. The opening can be formed in the insulating layer 151 over the plurality of bumps 156. The opening may subsequently be filled by a conductive material 149 as shown in FIG. 13c. In other words, a conductive material 149 such as copper metal, gold metal or other conductors discussed above may be deposited in the opening. It will be appreciated by one skilled in the art that although FIG. 13c shows the conductive material 149, the area now occupied by such conductive material 149 would have previously been the opening in the insulating layer 151 as discussed above, such opening being formed by suitable lithographic and etching techniques.

Figure 13D:
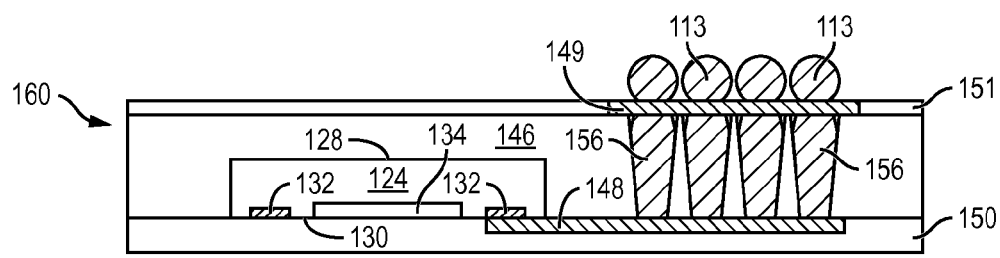

FIG. 13d shows the next step in processing the eWLB 160 from FIG. 13c after the conductive material 149 has been formed in the opening of the insulating layer 151, where the conductive material 149 is in electrical contact with the plurality of bumps 156. In this instance, a plurality of external interconnects 113 can be formed on the conductive material 149 for purposes of providing signal routing. The external interconnect 113 can be that of solder bumps, gold bumps or copper bumps followed by reflow, as necessary. The external interconnect 113 can also be formed of other suitable material as that discussed above, the purpose of the external interconnect 113 to facilitate signal routing and packaging of the eWLB 160.

Figure 14A:
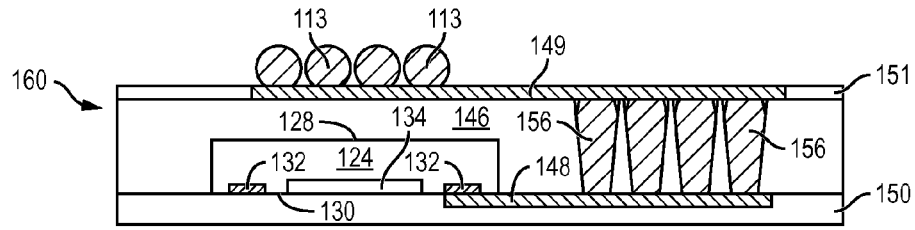
FIGS. 14a-14c illustrate different configurations of the eWLB according to FIGS. 13a-13d.
Figure 14B:
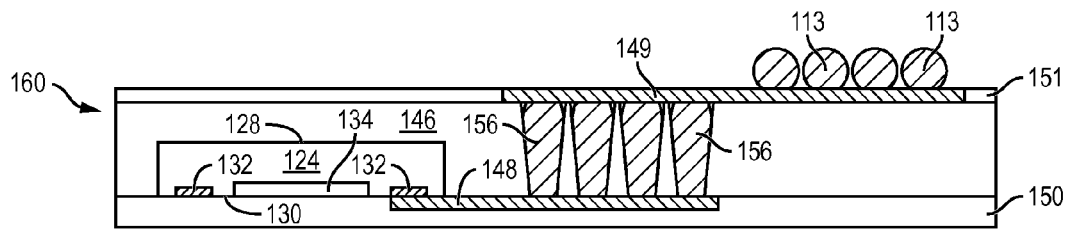
Figure 14C:
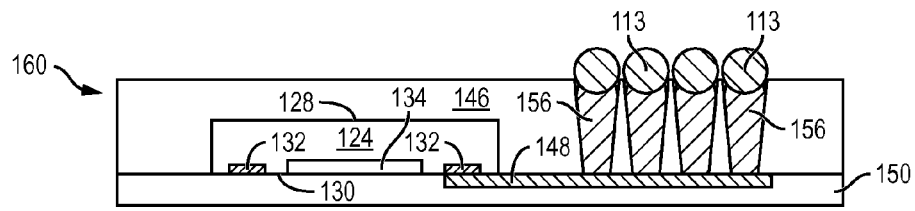

FIGS. 14a-14c illustrate three different configurations of the eWLB 160 using the process flow shown in FIGS. 13a-13d. In FIG. 14a, the opening in the insulating layer 151 can be made larger and more conductive material 149 can be deposited in the opening in comparison to FIG. 13d. In doing so, the conductive material 149 is able to extend underneath the semiconductor die 124 to provide a smaller footprint. In this embodiment, the total width of the external interconnects 113 may be substantially similar or even smaller than the width of the semiconductor die 124. In the alternative, in FIG. 14b, the opening in the insulating layer 151 can also be similarly made larger and more conductive material 149 can be deposited therein like FIG. 14a. However, in this instance, the conductive material 149 extends away from the semiconductor die 124 to provide a larger footprint. In this embodiment, the increased width added by the conductive material 149 and the external interconnects 113 may allow for higher I/O count and more complex integration of the eWLB 160. In FIG. 14c, according to another embodiment, the insulating layer 151 and the conductive material 149 need not be necessary and the eWLB 160 can be packaged by simply attaching external interconnects 113 directly to the plurality of bumps 156 followed by reflow.

Figure 15A:
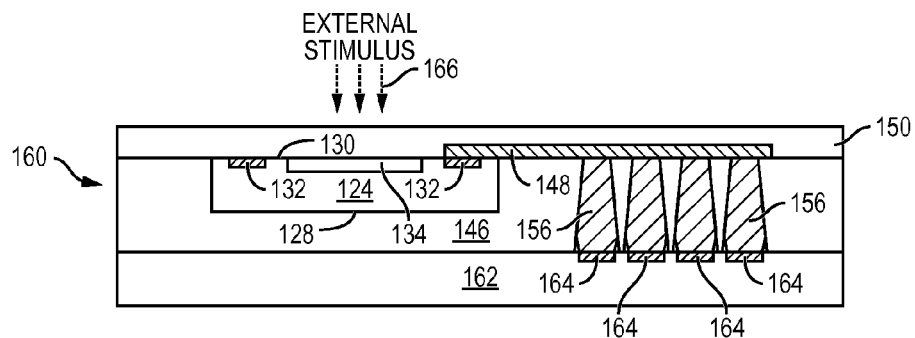
FIGS. 15a-15b illustrate different configurations of an eWLB with a transmissive layer formed over the semiconductor die.
Figure 15B:
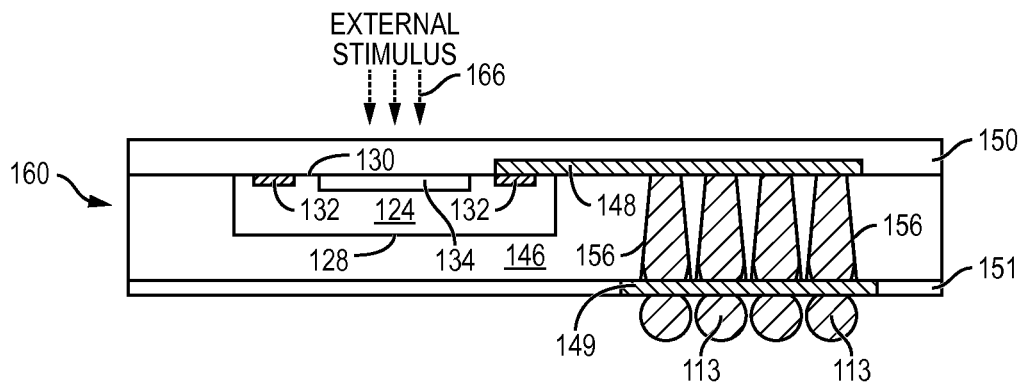

FIGS. 15a-15b illustrate two different configurations of the eWLB 160 with a transmissive layer 150 formed over the semiconductor die 124. FIG. 15a shows the eWLB 160 from FIG. 13b mounted to a substrate 162 with the plurality of bumps 156 metallurgically and electrically connected to a conductive layer 164. The substrate 162 and the conductive layer 164 can be formed using similar materials and methods as those discussed above and will not be elaborated in further detail herein. The active region 134 of the semiconductor die 124 may be oriented away from the substrate 162 for receiving external stimulus 166 through the transmissive layer 150. The active region 134 may be able to generate signals in response to the external stimulus 166. Like above, the external stimulus 166 can include without limitation tactile responses, optical sensing, capacitive and RF sensing, among others.

FIG. 15b shows the eWLB 160 from FIG. 13d where the active region 134 of the semiconductor die 124 is capable of receiving external stimulus 166 through the transmissive layer 150. In this instance, the eWLB 160 is not shown to be mounted to a substrate 162 with conductive layer 164 as seen in FIG. 15a, but it is understood by one skilled in the art that such packaging can be incorporated herein. In this embodiment, however, no substrate 162 may be necessary and the signal routing can be provided by the plurality of bumps 156 to the conductive material 149 and the external interconnects 113. And like above, the external stimulus 166 that can be received by the active region 134 includes without limitation tactile responses, optical sensing, capacitive and RF sensing, among others.

Figure 16A:
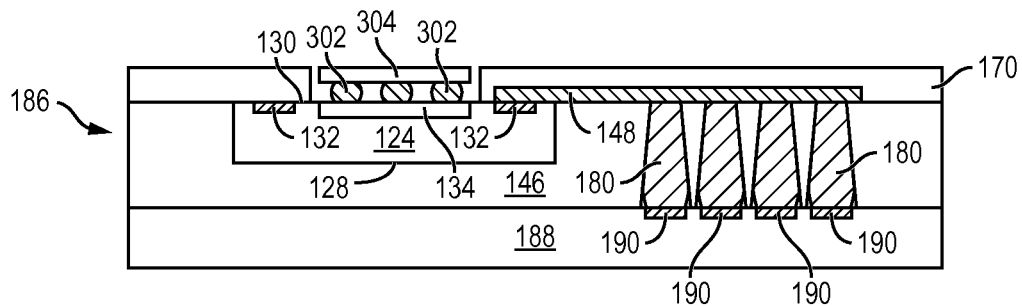
FIGS. 16a-16c illustrate different configurations of an eWLB with the window in the insulating layer over the active region of the semiconductor die.

FIG. 16a illustrates an eWLB 186 according to yet another embodiment of the present disclosure, the eWLB 186 being similar to FIG. 6d with a semiconductor die 124 having a back surface 128 and an active surface 130 with conductive layers 132 and an active region 134 formed thereon. The various components of the semiconductor die 124 can be formed using similar materials and techniques as those discussed above and will not be elaborated further herein. In this embodiment, the semiconductor die 124 can be considered a first semiconductor die 124. This will become more apparent in subsequent figures and discussion.

Similar to above, an encapsulant 146 may be deposited over the semiconductor die 124. In this instance, the encapsulant 146 may be formed around the semiconductor die 124. In one embodiment, the encapsulant 146 may be referred to as the first encapsulant 146, which can be formed around the first semiconductor die 124.

Next, a conductive layer 148 can be deposited over the first encapsulant 146 and the first semiconductor die 124. Subsequently, a transmissive layer 170 may be formed over the first semiconductor die 124 including the active region 134. This can be followed by the formation of a plurality of bumps 180 by photolithography, etching and plating through the first encapsulant 146, the plurality of bumps 180 being electrically connected to the conductive layer 148. The bumps 180 can also be formed by other suitable deposition techniques as can be appreciated by one skilled in the art. In some embodiments, the plurality of bumps 180 may also be referred to as an interconnect structure as it provides the eWLB 186 with internal connectivity.

In one embodiment, the plurality of bumps 180 are formed off to only one side of the first semiconductor die 124 as shown in FIG. 16a, similar to that shown in FIG. 13a. And like above, the plurality of bumps 180 can be clustered off to the right-hand side of the first semiconductor die 124 although it will be understood that the plurality of bumps 180 can also be clustered off to only the left-hand side of the first semiconductor die 124. The clustering of bumps 180 in this instance is able to function as a high density via block similar to that disclosed above.

An opening or cavity may subsequently be formed in the transmissive layer 170 over the active region 134 of the first semiconductor die 124 by suitable lithographic and etching techniques. In this instance, the opening in the transmissive layer 170 allows the first semiconductor die 124 to be exposed for subsequent chip to chip assembly. In other words, the opening allows stacked die or stacked chip assembly of the eWLB 186.

In one embodiment, a second semiconductor die 304 may be disposed in the cavity over the first semiconductor die 124 as shown in FIG. 16a. The second semiconductor die 304 may maintain electrical connectivity with the first semiconductor die 124 via a plurality of internal interconnects 302. The eWLB 186 may subsequently be mounted over a substrate 188 with conductive contacts 190 similar to that shown in FIG. 15a.

In some embodiments, face-to-face connections may be made between the second semiconductor die 304 and the first semiconductor die 124 without the use of internal interconnects 302. In doing so the eWLB 186 can be expanded to include other semiconductor packages and not necessarily be limited to sensors or sensor-type packages.

Figure 16B:
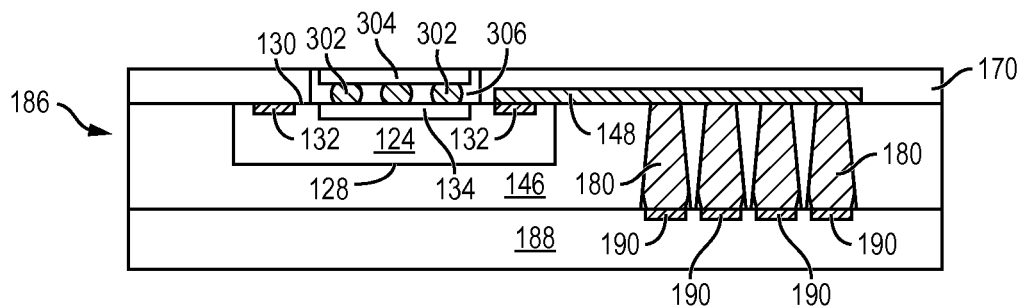

FIG. 16b shows the next step in processing the eWLB 186 from FIG. 16a after the second semiconductor die 304 has been mounted over the first semiconductor die 124 according to another embodiment of the present disclosure. In this embodiment, the second semiconductor die 304 need not protrude from the upper surface of the transmissive layer 170 but instead can be flush or planar with the transmissive layer 170 such that a second encapsulant 306 can be formed around the second semiconductor die 304. This second encapsulant 306 can be formed of similar material as the first encapsulant 146. The second encapsulant 306 can also be formed by other suitable deposition technique as can be appreciated by one skilled in the art.

Figure 16C:
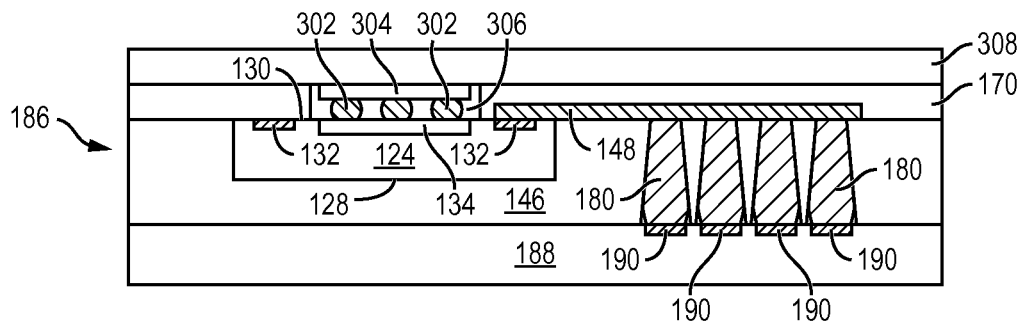

FIG. 16c shows the next step in processing the eWLB 186 from FIG. 16b after the second encapsulant 306 has been deposited around the second semiconductor die 304 according to yet another embodiment of the present disclosure. In this embodiment, another transmissive layer 308 may be deposited or formed over the second semiconductor die 304. In this instance, this subsequent or second transmissive layer 308 can be formed over the first transmissive layer 170. The second transmissive layer 308 can have the same or similar material properties as those of the first transmissive layer 170. In other embodiments, the second transmissive layer 308 can have different material properties than the first transmissive layer 170. Like the first transmissive layer 170, the second transmissive layer 308 can also receive external stimulus.

In some embodiments, the second semiconductor die 304 may include a sensor or an active region (not shown) which can be responsive to an external stimulus passing through the second transmissive layer 308 similar to external stimulus passing through the first transmissive layer 170 and being received by the first semiconductor device 124 as discussed above. The types of external stimulus that can pass through the second transmissive layer 170 include without limitation tactile responses, optical sensing, capacitive and RF sensing, among others. Similar to above, the second transmissive layer 170 includes an optical dielectric material or an optical transparent or translucent material. In operation, as the external stimulus passes through the second transmissive layer 170 to the second semiconductor die 308, electrical activities can be relayed from the second semiconductor device 308 to the first semiconductor die 124 for further processing, with the stimulus and signals being transmitted through the plurality of bumps 180 and the conductive contacts 190.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a first semiconductor die;
depositing a first encapsulant over and completely surrounding the first semiconductor die;
forming a first transmissive layer over an active surface of the first semiconductor die including an opening formed through the first transmissive layer;
disposing a second semiconductor die in the opening of the first transmissive layer with the second semiconductor die coupled to the first semiconductor die by direct chip to chip assembly; and
depositing a second encapsulant between the first semiconductor die and second semiconductor die and between the second semiconductor die and transmissive layer, wherein a top surface of the second encapsulant is coplanar with a top surface of the first transmissive layer.

2. The method of claim 1, further including forming a second transmissive layer over the second semiconductor die and second encapsulant.

3. The method of claim 2, wherein the second semiconductor die is a sensor responsive to an external stimulus passing through the second transmissive layer.

4. The method of claim 2, wherein the second transmissive layer includes an optical dielectric material or an optical transparent or translucent material.

5. A semiconductor device, comprising:
a first semiconductor die including a light-sensitive sensor formed in an active region of the first semiconductor die;
a first encapsulant deposited over and extending completely around side surfaces of the first semiconductor die;
a first conductive layer formed directly on the first encapsulant and the first semiconductor die;
a first optically transmissive layer formed on the first semiconductor die over the active region and first conductive layer including an opening completely through the first optically transmissive layer;
a second semiconductor die disposed in the opening of the first optically transmissive layer and connected to the first semiconductor die by direct chip to chip assembly using a plurality of first conductive bumps;
a second encapsulant deposited within the opening of the first optically transmissive layer between the second semiconductor die and first optically transmissive layer and contacting the first semiconductor die and side surfaces of the second semiconductor die and first optically transmissive layer;
a second conductive bump formed completely through the first encapsulant directly over the first conductive layer and completely outside a footprint of the first semiconductor die; and
a substrate including the first semiconductor die mounted to the substrate with a second conductive layer of the substrate directly metallurgically connected to the second conductive bump and with the second conductive bump including a portion of solder extending uninterrupted between the first conductive layer and second conductive layer.

6. The semiconductor device of claim 5, wherein the external stimulus passing through the second transmissive layer further includes a tactile response.

7. The semiconductor device of claim 5, further including a second transmissive layer formed over the second semiconductor die, wherein the second semiconductor die further includes an active region responsive to an external stimulus passing through the second transmissive layer.

8. The semiconductor device of claim 5, wherein the active region of the second semiconductor die includes a sensor.

9. A semiconductor device, comprising:
a first semiconductor die;
a first encapsulant deposited over and completely surrounding the first semiconductor die;
a first transmissive layer formed over an active surface of the first semiconductor die including an opening formed through the first transmissive layer;
a second semiconductor die disposed in the opening of the first transmissive layer and coupled to the first semiconductor die by direct chip to chip assembly; and a second encapsulant deposited between the first semiconductor die and second semiconductor die and between the second semiconductor die and transmissive layer, wherein a top surface of the second encapsulant is coplanar with a top surface of the first transmissive layer.

10. The semiconductor device of claim 9, wherein an active region of the first semiconductor die is responsive to an external stimulus passing through the first transmissive layer.

11. The semiconductor device of claim 9, wherein the second semiconductor die is a sensor responsive to an external stimulus.

12. The semiconductor device of claim 9, further including a second transmissive layer formed over the second semiconductor die.

13. The semiconductor device of claim 9, further including an interconnect structure formed through the first encapsulant.

* * * * *